(12) United States Patent
Ko et al.

(10) Patent No.: US 12,243,963 B2
(45) Date of Patent: Mar. 4, 2025

(54) LIGHT EMITTING ELEMENT INK AND METHOD OF MANUFACTURING DISPLAY DEVICE

(71) Applicant: Samsung Display Co., LTD., Yongin-si (KR)

(72) Inventors: Hyo Jin Ko, Seoul (KR); Duk Ki Kim, Suwon-si (KR); Jun Bo Sim, Suwon-si (KR); Na Mi Hong, Cheonan-si (KR); Yong Hwi Kim, Asan-si (KR); Chang Hee Lee, Seoul (KR); Jae Kook Ha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 797 days.

(21) Appl. No.: 17/319,602

(22) Filed: May 13, 2021

(65) Prior Publication Data

US 2022/0037559 A1 Feb. 3, 2022

(30) Foreign Application Priority Data

Aug. 3, 2020 (KR) .......... 10-2020-0096767

(51) Int. Cl.
*H01L 33/26* (2010.01)
*C09D 11/38* (2014.01)
(Continued)

(52) U.S. Cl.
CPC .............. *H01L 33/26* (2013.01); *C09D 11/38* (2013.01); *C09D 11/50* (2013.01); *C09K 11/025* (2013.01);
(Continued)

(58) Field of Classification Search
CPC ....... H01L 33/26; H01L 33/42; H01L 33/502; H01L 2933/0041; C09K 11/025; G02F 1/167
See application file for complete search history.

(56) References Cited

U.S. PATENT DOCUMENTS 12,094,857 B2 9/2024 Jung et al.
2018/0019369 A1* 1/2018 Cho ................. H01L 33/32
(Continued)

FOREIGN PATENT DOCUMENTS

| EP | 3 855 418 | 7/2021 |
| EP | 3 876 293 | 9/2021 |

(Continued)

OTHER PUBLICATIONS

Extended European search report for European Patent Application or Patent No. 21185644.8 dated Dec. 14, 2021.

*Primary Examiner* — Mark W Tornow
(74) *Attorney, Agent, or Firm* — KILE PARK REED & HOUTTEMAN PLLC

(57) ABSTRACT

A light emitting element ink comprises a light emitting element solvent, a light emitting element dispersed in the light emitting element solvent, the light emitting element including a plurality of semiconductor layers, and an insulating film surrounding outer surfaces of the plurality of semiconductor layers, and a thickener dispersed in the light emitting element solvent, wherein the thickener includes a compound represented by Chemical Structural Formula 1 as a polyol-based compound capable of forming a hydrogen bond with the light emitting element solvent or another thickener, and the thickener has a boiling point in a range of about 200° C. to about 450° C.

22 Claims, 19 Drawing Sheets

(51) Int. Cl.
*C09D 11/50* (2014.01)
*C09K 11/02* (2006.01)
*G02F 1/167* (2019.01)
*H01L 33/42* (2010.01)
*H01L 33/50* (2010.01)

(52) U.S. Cl.
CPC ............. *G02F 1/167* (2013.01); *H01L 33/42* (2013.01); *H01L 33/502* (2013.01); *H01L 2933/0016* (2013.01); *H01L 2933/0041* (2013.01)

(56) References Cited

U.S. PATENT DOCUMENTS

2018/0215856 A1* 8/2018 Ruhlmann ............... C09D 7/43
2021/0202800 A1* 7/2021 Jung ....................... C07F 5/027
2021/0238435 A1* 8/2021 Sim ..................... H01L 33/0095
2021/0273131 A1* 9/2021 Kang ....................... H01L 24/95

FOREIGN PATENT DOCUMENTS

| | | |
|---|---|---|
| JP | 2011-205106 | 10/2011 |
| KR | 10-2013-0117766 | 10/2013 |
| KR | 10-1770632 | 8/2017 |
| KR | 10-2020-0050000 | 5/2020 |
| KR | 10-2021-0095776 | 8/2021 |
| KR | 10-2021-0098589 | 8/2021 |
| WO | 2020/040368 | 2/2020 |
| WO | 2020/060006 | 3/2020 |
| WO | 2020/091174 | 5/2020 |
| WO | 2020/189924 | 9/2020 |

* cited by examiner

LIGHT EMITTING ELEMENT INK AND METHOD OF MANUFACTURING DISPLAY DEVICE

CROSS-REFERENCE TO RELATED APPLICATION(S)

This application claims priority to and the benefit of Korean Patent Application No. 10-2020-0096767 under 35 U.S.C. § 119, filed in the Korean Intellectual Property Office (KIPO) on Aug. 3, 2020, the entire contents of which are incorporated herein by reference.

BACKGROUND

1. Technical Field

The disclosure relates to a light emitting element ink and a method of manufacturing a display device. More specifically, the invention relates to a light emitting element ink capable of adjusting a viscosity according to temperature by including a thickener and a method of manufacturing a display device using the light emitting element ink.

2. Description of the Related Art

The importance of a display device has increased with the development of multimedia. Accordingly, various types of display devices such as an organic light emitting display (OLED) and a liquid crystal display (LCD) have been used.

A display device for displaying an image includes a display panel such as an organic light emitting display panel or a liquid crystal display panel. Among display panels, an organic light emitting display panel includes an organic light emitting element, such as a light emitting diode (LED). The light emitting diode (LED) includes an organic light emitting diode (OLED) using an organic material as a fluorescent material and an inorganic light emitting diode using an inorganic material as a fluorescent material.

SUMMARY

An aspect of the disclosure is to provide a light emitting element ink that may be stored for a long time in a state in which light emitting elements are dispersed, by including a thickener.

Another aspect of the disclosure is to provide a method of manufacturing a display device using the light emitting element ink, in which foreign matter is completely removed after a printing process to improve product reliability.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a light emitting element ink may include a light emitting element solvent, a light emitting element dispersed in the light emitting element solvent, the light emitting element including a plurality of semiconductor layers, and an insulating film surrounding outer surfaces of the plurality of semiconductor layers, and a thickener dispersed in the light emitting element solvent. The thickener may include a compound represented by Chemical Structural Formula 1 below as a polyol-based compound capable of forming a hydrogen bond with the light emitting element solvent or another thickener, and the thickener may have a boiling point in a range of about 200° C. to about 450° C.,

[Chemical Structural Formula 1]

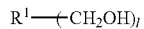

wherein, in Chemical Structural Formula 1, $R^1$ is a linear or branched alkyl group or a linear or branched alkyl ether group having 1 to 3000 carbon atoms, the linear or branched alkyl group and the linear or branched alkyl ether group are substituted with a hydroxyl group (—OH) or is unsubstituted, and I is an integer of 1 to 10.

The thickener may include a compound represented by one of Chemical Formulas 1 to 8 below:

[Chemical Formula 1]
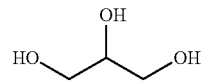

[Chemical Formula 2]
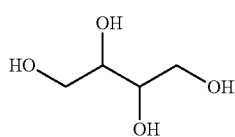

[Chemical Formula 3]
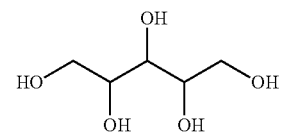

[Chemical Formula 4]
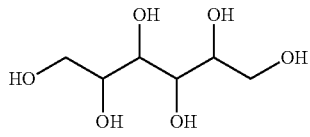

[Chemical Formula 5]

[Chemical Formula 6]

[Chemical Formula 7]

[Chemical Formula 8]
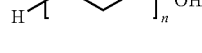

wherein, in Chemical Formulas 7 and 8, n is an integer of 1 to 1000.

The thickener may form an intermolecular hydrogen bond with the light emitting element solvent at a temperature of about 25° C. and the thickener to form a network structure.

The light emitting element ink may have a viscosity in a range of about 20 cP to about 300 cP at a temperature of about 25° C.

The light emitting element ink may have a viscosity in a range of about 5 cP to about 15 cP at a temperature in a range of about 40° C. to about 60° C.

An amount of the light emitting element may be in a range of about 0.01 to about 1 part by weight with respect to 100 parts by weight of the light emitting element ink, and an amount of the thickener may be in a range of about 5 to about 50 parts by weight with respect to 100 parts by weight of the light emitting element ink.

The light emitting element ink may further comprise a dispersant dispersed in the light emitting element solvent, wherein an amount of the dispersant may be in a range of about 10 to 100 parts by weight with respect to 100 parts by weight of the light emitting element.

The plurality of semiconductor layers of the light emitting element may include a first semiconductor layer, a second semiconductor layer, and a light emitting layer between the first semiconductor layer and the second semiconductor layer. The insulating film of the light emitting element may be disposed to surround at least an outer surface of the light emitting layer.

According to an embodiment of the disclosure, a method of manufacturing a display device may include preparing a light emitting element ink including a light emitting element solvent, a plurality of light emitting elements, and a thickener, preparing a target substrate provided with a first electrode and a second electrode, ejecting the light emitting element ink onto the target substrate at a first temperature, forming an electric field on the target substrate to place the plurality of light emitting elements on the first electrode and the second electrode, and heating the light emitting element ink under a low-pressure environment to remove the light element solvent and the thickener.

The thickener of the light emitting element ink may include a polyol-based compound capable of forming a hydrogen bond with the light emitting element solvent or another thickener.

The thickener may include a compound represented by one of Chemical Formulas 1 to 8 above.

An amount of the plurality of light emitting elements may be in a range of about 0.01 to about 1 part by weight with respect to 100 parts by weight of the light emitting element ink, and an amount of the thickener may be in a range of about 100 to about 500 parts by weight with respect to 100 parts by weight of the plurality of light emitting elements.

In the preparation of the light emitting element ink, the thickener may form an intermolecular hydrogen bond with the light emitting element solvent and another thickener to form a network structure.

In the preparing of the light emitting element ink, the light emitting element ink may have a viscosity in a range of about 20 cP to about 300 cP at a temperature of about 25° C.

The ejecting of the light emitting element ink may be performed by a printing process by an inkjet printing apparatus, and the light emitting element ink may be ejected onto the target substrate through a nozzle at the first temperature higher than about 25° C.

In the ejecting of the light emitting element ink, the first temperature may be in a range of about 40° C. to about 60° C., and the light emitting element ink may have a viscosity in a range of about 5 cP to about 15 cP at the first temperature.

In the placing of the plurality of light emitting elements, the target substrate may be heat-treated to form the electric field at the first temperature or higher.

The removing of the light emitting element solvent and the thickener may be performed at a pressure in a range of about $10^{-4}$ Torr to about 1 Torr, and the first temperature may be in a range of about 25° C. to about 150° C.

In the placing of the plurality of light emitting elements, a first end of each of the plurality of light emitting elements may be disposed on the first electrode, and a second end of each of the plurality of light emitting elements may be disposed on the second electrode.

The plurality of light emitting elements may include a first semiconductor layer, a second semiconductor layer, an active layer between the first semiconductor layer and the second semiconductor layer, and an insulating film disposed to surround at least an outer surface of the active layer.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which some embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Hereinafter, embodiments of the disclosure will be described with reference to the attached drawings.

Figure 1:
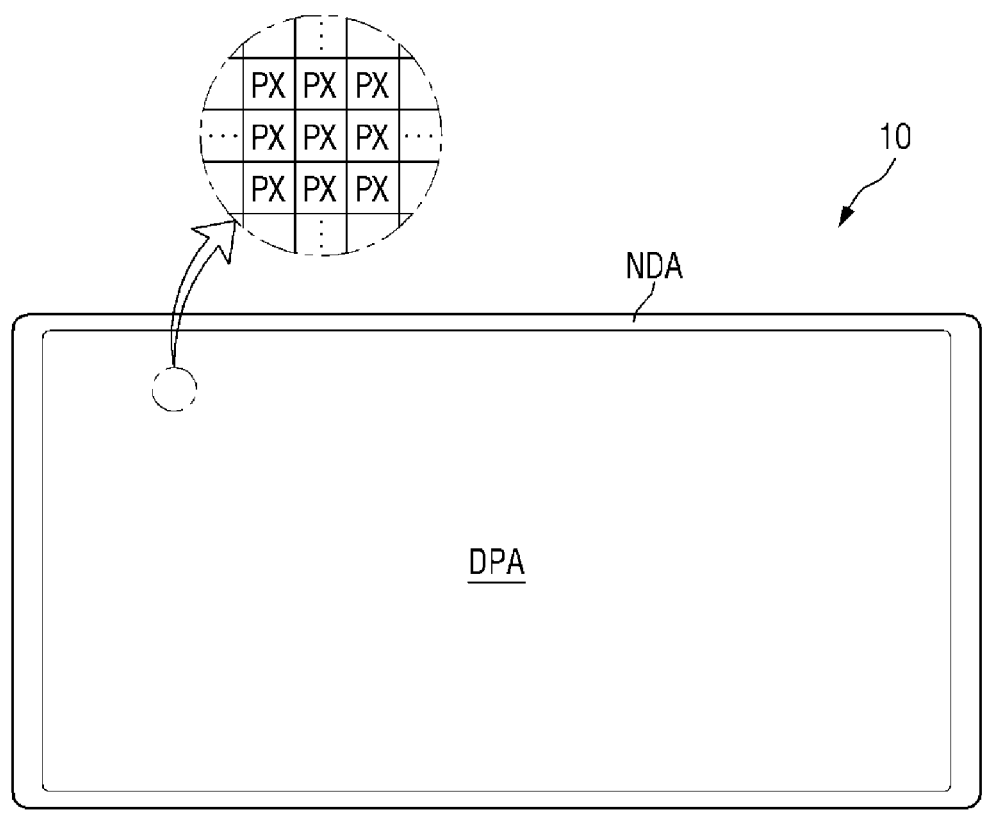
FIG. 1 is a schematic plan view of a display device according to an embodiment.
Figure 1:
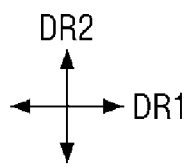

FIG. 1 is a schematic plan view of a display device according to an embodiment.

Referring to FIG. 1, a display device 10 may display a mobile image or a still image. The display device 10 may refer to any electronic device that provides a display screen. For example, the display device 10 may be used in televisions, laptop computers, monitors, billboards, internet of things devices, mobile phones, smartphones, tablet personal computers (PCs), electronic watches, smartwatches, watch phones, head mounted displays, mobile communication terminals, electronic notebooks, electronic books, portable multimedia players (PMPs), navigation system, game consoles, digital cameras, camcorders, and the like.

The display device 10 may include a display panel for providing a display screen. Examples of the display panel may include an inorganic light emitting diode display panel, an organic light emitting display panel, a quantum dot light emitting display panel, a plasma display panel, and a field emission display panel. Hereinafter, an inorganic light emitting diode display panel may be used as an example of the display panel, but the disclosure is not limited thereto. Any display panel may be used as the display panel as long as the same technical idea is applicable.

The shape of the display device 10 may be variously modified. For example, the display device 10 may have a shape such as a rectangle having longer horizontal sides, a rectangle having longer vertical sides, a square, a rectangle having rounded corners (vertexes), another polygon, or a circle. The shape of a display area DPA of the display device 1 may also be similar to the overall shape of the display device 10. FIG. 1 illustrates a display device 10 and a display area DPA each having a rectangular shape having longer horizontal sides.

The display device 10 may include a display area DPA and a non-display area NDA. The display area DPA may be an area where an image may be displayed, and the non-display area NDA may be an area where an image is not displayed. The display area DPA may be referred to as an active area, and the non-display area NDA may be referred to as an inactive area. The display area DPA may generally occupy the center of the display device 10.

The display area DPA may include pixels PX. The pixels PX may be arranged in a matrix direction. Each of the pixels PX may have a rectangular shape or a square shape in a plan view, but the shape thereof is not limited thereto. Each of the pixels PX may have a rhombic shape in which each side is inclined with respect to a direction. The respective pixels PX may be alternately arranged in a stripe or Pentile type. Each of the pixels PX may include at least one light emitting element 30 emitting light of a specific wavelength band to display a specific color.

The non-display area NDA may be disposed around the display area DPA. The non-display area NDA may entirely or partially surround the display area DPA. The display area DPA may have a rectangular shape, and the non-display area NDA may be disposed adjacent to four sides of the display area DPA. The non-display area NDA may form (or constitute) a bezel of the display device 10. Wirings or circuit drivers included in the display device 10 may be disposed in the non-display area NDA, or external devices may be mounted in the non-display area NDA.

Figure 2:
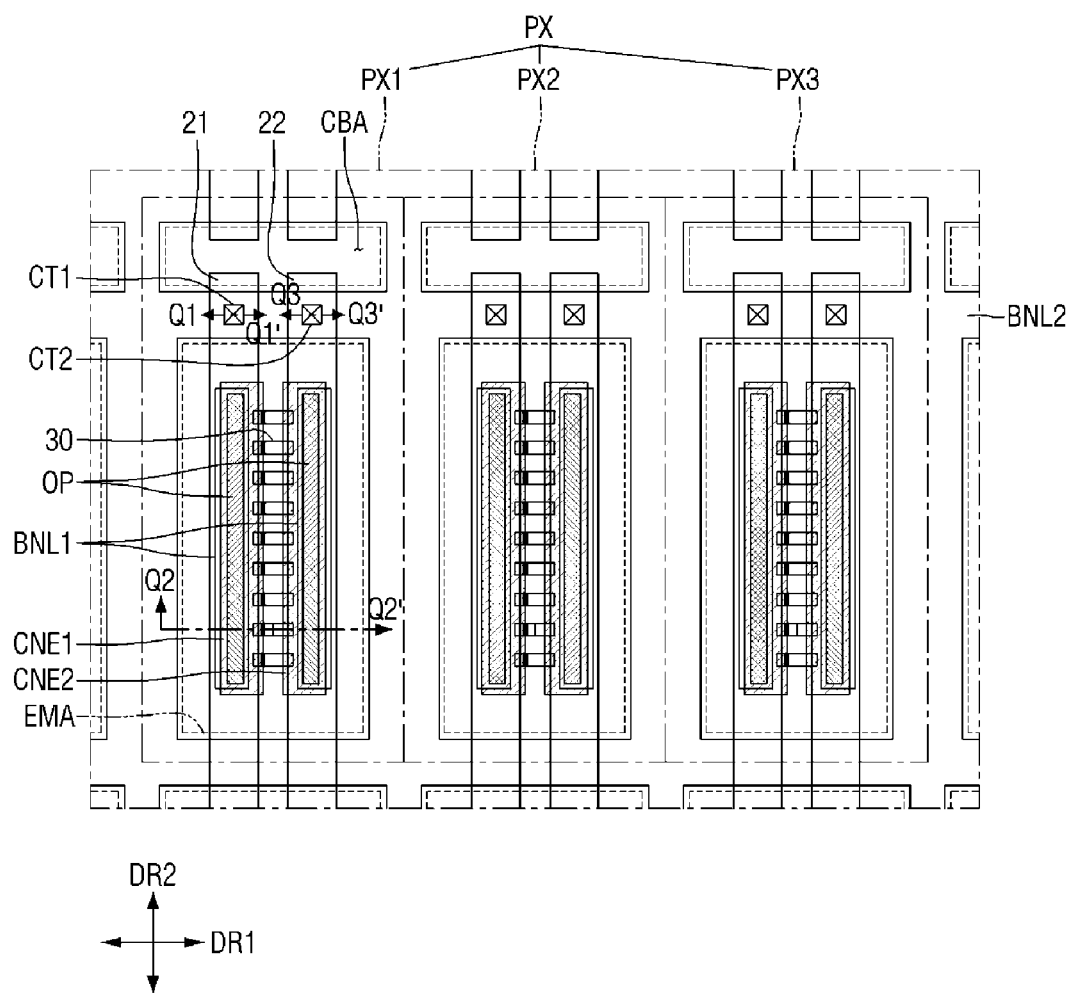
FIG. 2 is a schematic plan view illustrating a pixel of a display device according to an embodiment.

FIG. 2 is a schematic plan view illustrating a pixel of a display device according to an embodiment.

Referring to FIG. 2, each of the pixels PX may include sub-pixels PXn (where n is an integer of 1 to 3). For example, a pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the disclosure is not limited thereto, and each of the sub-pixels PXn may emit light of the same color. Although FIG. 2 illustrates that the pixel PX may include three sub-pixels PXn, the disclosure is not limited thereto, and the pixel PX may include a larger number of sub-pixels PXn.

Each of the sub-pixels PXn of the display device 10 may include a light emitting area EMA and a non-light emitting area (not shown). The light emitting area EMA may be defined as an area in which the light emitting element 30 is disposed to emit light of a specific wavelength band, and the non-light emitting area may be defined as an area in which no light emitting element 30 is disposed and which rays of light emitted from the light emitting element 30 do not reach so that no light is emitted therefrom. The light emitting area EMA may include an area in which the light emitting element 30 is disposed, and an area adjacent to the light emitting element 30 to emit light emitted from the light emitting element 30.

However, the disclosure is not limited thereto, and the light emitting area may also include an area in which light emitted from the light emitting element 30 is reflected or refracted by another member and then emitted. Light emitting elements 30 may be arranged in each of the sub-pixels PXn, and an area in which the light emitting elements 30 are arranged and an area adjacent thereto may form the light emitting area EMA.

Each of the sub-pixels PXn may include a cut area CBA disposed in the non-light emitting area. The cut area CBA may be disposed at a side of the light emitting area EMA in a second direction DR2. The cut area CBA may be disposed between the light emitting areas EMA of the neighboring sub-pixels PXn in the second direction DR2. Multiple light emitting areas EMA and multiple cut areas CBA may be arranged in the display area DPA of the display device 10. For example, the light emitting areas EMA and the cut areas CBA may be repeatedly arranged in a first direction DR1, respectively, and may be alternately arranged in the second direction DR2. The distance between the cut areas CBA spaced apart from each other in the first direction DR1 may be smaller than the distance between the light emitting areas EMA spaced apart from each other in the first direction DR1. A second bank BNL2 may be disposed between the cut areas CBA and the light emitting areas EMA, and the distance therebetween may be changed depending on the width of the second bank BNL2. Since the light emitting element 30 is not disposed in the cut area CBA, light is not emitted therefrom, but some of electrodes 21 and 22 disposed in each of the sub-pixels PXn may be disposed in the cut areas CBA. The electrodes 21 and 22 disposed for each of the sub-pixels PXn may be disposed separately from each other in the cut area CBA.

Figure 3:
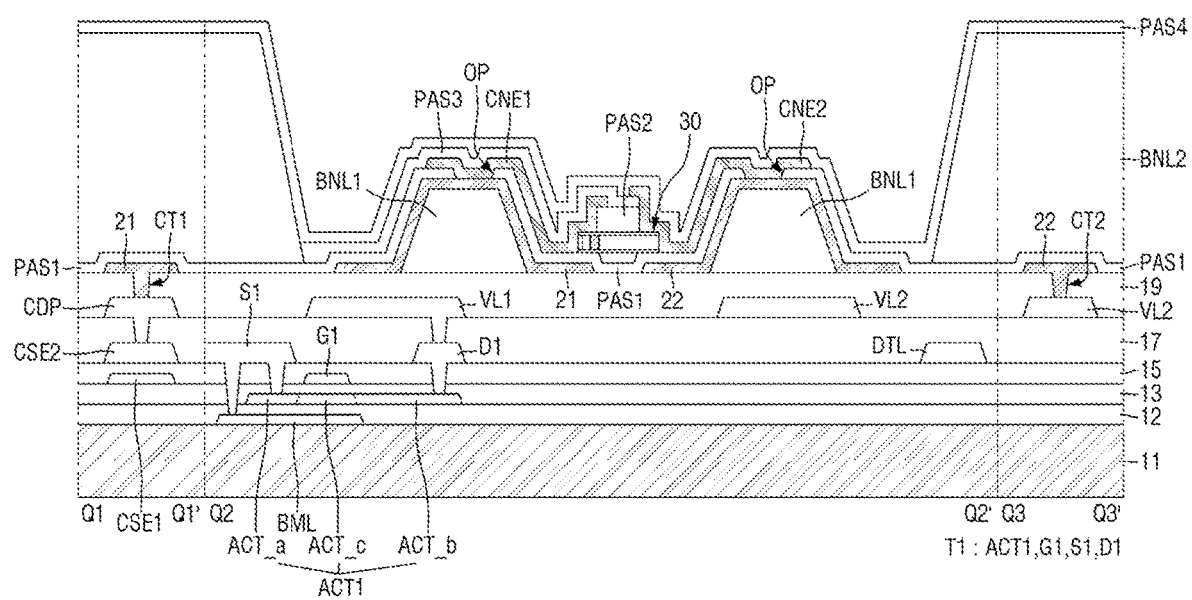
FIG. 3 is a schematic cross-sectional view taken along the lines Q1-Q1', Q2-Q2', and Q3-Q3' of FIG. 2.

FIG. 3 is a schematic cross-sectional view taken along lines Q1-Q1', Q2-Q2', and Q3-Q3' of FIG. 2. FIG. 3 illustrates a cross section across ends of the light emitting element 30 disposed in the first sub-pixel PX1 of FIG. 2.

Referring to FIG. 3 together with FIG. 2, the display device 10 may include a first substrate 11, and a semiconductor layer, conductive layers, and insulating layers, which are disposed on the first substrate 11. The semiconductor layer, the conductive layers, and the insulating layers may form a circuit layer and a light emitting element layer of the display device 10.

The first substrate 11 may be an insulating substrate. The first substrate 11 may be made of an insulating material such as glass, quartz, or polymer resin. The first substrate 11 may be a rigid substrate but may be a flexible substrate capable of bending, folding, rolling, or the like.

A light blocking layer BML may be disposed on the first substrate 11. The light blocking layer BML is disposed to overlap an active layer ACT1 of a first transistor T1. The active layer ACT1 may include a first region ACT_a, a second region ACT_b, and a channel region ACT_c. The light blocking layer BML1 may include a material blocking light, thereby preventing light from entering the active layer ACT1 of the first transistor T1. For example, the light blocking layer BML may be formed of an opaque metal material that blocks light transmission. However, the disclosure is not limited thereto. For example, the light blocking layer BML may be omitted.

A buffer layer 12 may be entirely disposed on the first substrate 11. For example, the buffer layer 12 may be disposed to cover or overlap the light blocking layer BML and the upper surface of the first substrate 11. The buffer layer 12 may be formed on the first substrate 11 to protect the first transistors T1 of the pixel PX from moisture penetrating through the first substrate 11 which is vulnerable to moisture permeation and may perform a surface planarization function.

The active layer ACT1 may be disposed on the buffer layer 12. The active layer ACT1 may be disposed to partially overlap a gate electrode G1 or a first conductive layer to be described below.

In the drawing, only the first transistor T1 among the transistors included in the sub-pixel PXn of the display device 10 is illustrated in the drawings, but the disclosure is not limited thereto. The display device 10 may include a larger number of transistors. For example, the display device 10 may include two or three transistors, including one or more transistors in addition to the first transistor T1, for each sub-pixel PXn.

The active layer ACT1 may include polycrystalline silicon, monocrystalline silicon, or an oxide semiconductor. In case that the active layer ACT1 includes an oxide semiconductor, the active layer ACT1 may include conducting regions and the channel region therebetween. The oxide semiconductor may be an oxide semiconductor containing indium (In). For example, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc oxide (IGZO), or indium-gallium-zinc-tin oxide (IGZTO).

In another embodiment, the active layer ACT1 may include polycrystalline silicon. Polycrystalline silicon may be formed by crystallizing amorphous silicon, and in this case, the conducting regions of the active layer ACT1 may be regions doped with impurities, respectively.

A first gate insulating layer 13 may be disposed on the active layer ACT1 and the buffer layer 12. For example, the first gate insulating layer 13 may be disposed to entirely cover or overlap the active layer ACT1 and the buffer layer 12. The first gate insulating layer 13 may function as a gate insulating film of each transistor.

The first conductive layer may be disposed on the first gate insulating layer 13. The first conductive layer may include a gate electrode G1 of the first transistor T1 and a first capacitive electrode CSE1 of the storage capacitor. The gate electrode G1 may be disposed to overlap the channel region ACT_c of the active layer ACT1 in a thickness direction. The first capacitive electrode CSE1 may be disposed to overlap a second capacitive electrode CSE2, which will be described below, in the thickness direction. In an embodiment, the first capacitive electrode CSE1 may be integral with the gate electrode G1. The first capacitor electrode CSE1 may be disposed to overlap the second capacitor electrode CSE2 in the thickness direction, and the storage capacitor may be formed therebetween.

A first interlayer insulating layer 15 may be disposed on the first conductive layer. The first interlayer insulating layer 15 may function as an insulating film between the first conductive layer and other layers disposed thereon. The first interlayer insulating layer 15 may be disposed to overlap the first conductive layer to perform a function of protecting the first conductive layer.

A second conductive layer may be disposed on the first interlayer insulating layer 15. The second conductive layer may include a first source electrode S1 and a first drain electrode D1 of the first transistor T1, a data line DTL, and a second capacitive electrode CSE2.

The first source electrode S1 and first drain electrode D1 of the first transistor T1 may contact the doped regions of the active layer ACT1 through contact holes penetrating the first interlayer insulating layer 15 and the first gate insulating layer 13, respectively. Further, the first source electrode S1 of the first transistor T1 may contact the light blocking layer BML through another contact hole.

The data line DTL may apply a data signal to another transistor (not shown) included in the display device 10. Although not shown in the drawings, the data line DTL may be electrically connected to a source/drain electrode of another transistor to transfer a signal applied from the data line DTL.

The second capacitive electrode CSE2 may be disposed to overlap the first capacitive electrode CSE1 in the thickness direction. In an embodiment, the second capacitive electrode CSE2 may be integral with and/or electrically connected to the first source electrode S1.

A second interlayer insulating layer 17 may be disposed on the second conductive layer. The second interlayer insulating layer 17 may function as an insulating film between the second conductive layer and other layers disposed thereon. The second interlayer insulating layer 17 may be disposed to overlap the second conductive layer to perform a function of protecting the second conductive layer.

A third conductive layer may be disposed on the second interlayer insulating layer 17. The third conductive layer may include a first voltage line VL1, a second voltage line VL2, and a first conductive pattern CDP. A high-potential voltage (or first power voltage) supplied to the first transistor T1 may be applied to first voltage line VL1, and a low-potential voltage (or second power voltage) supplied to the second electrode 22 may be applied to the second voltage line VL2. During the process of manufacturing the display device 10, an alignment signal necessary to align the light emitting elements 30 may be applied to the second voltage line VL2.

The first conductive pattern CDP may be electrically connected to the second capacitive electrode CSE2 through a contact hole formed in the second interlayer insulating layer 17. The second capacitive electrode CSE2 may be integral with the first source electrode S1 of the first transistor T1, and the first conductive pattern CDP may be electrically connected to the first source electrode S1. The first conductive pattern CDP may contact a first electrode 21, which will be described below, and the first transistor T1 may transfer a first power voltage applied from the first voltage line VL1 to the first electrode 21 through the first conductive pattern CDP. Although it is shown in the drawings that the third conductive layer includes one second voltage line VL2 and one first voltage line VL1, the disclosure is not limited thereto. The third conductive layer may include a larger number of first voltage lines VL1 and a larger number of second voltage lines VL2.

Each of the buffer layer 12, the first gate insulating layer 13, the first interlayer insulating layer 15, the second interlayer insulating layer 17, and a third interlayer insulating layer may be formed of inorganic layers alternately stacked. For example, each of the buffer layer 12, the first gate insulating layer 13, the first interlayer insulating layer 15, and the second interlayer insulating layer 17 may be formed as double layers in which inorganic layers each including at least one of silicon oxide ($SiO_x$), silicon nitride ($SiN_x$), and silicon oxynitride ($SiO_xN_y$), or as multiple layers in which theses inorganic layers are alternately stacked. As another example, each of the above layers may also be formed of an inorganic layer.

A first planarization layer 19 may be disposed on the third conductive layer. The first planarization layer 19 may include an organic insulating material, for example, an organic material such as polyimide (PI), to perform a surface planarization function.

First banks BNL1, electrodes 21 and 22, a light emitting element 30, contact electrodes CNE1 and CNE2, and a second bank BNL2 may be arranged on the first planarization layer 19. Further, insulating layers PAS1, PAS2, PAS3, and PAS4 may be disposed on the first planarization layer 19.

The first banks BNL1 may be directly disposed on the first planarization layer 19. A first bank BNL1 may have a shape having a predetermined width and extending in the second direction DR2 within each sub-pixel PXn but may not extend to another neighboring sub-pixel PXn in the second direction DR2 and may be disposed in the light emitting area EMA. The first banks BNL1 may be spaced apart from each other in the first direction DR1.

The first banks BNL1 may be disposed in a sub-pixel PXn. Although it is shown in the drawings that two first banks BNL1 are disposed for each sub-pixel PXn to form a linear pattern in the display area DPA, the disclosure is not limited thereto. A larger number of first banks BNL1 may be arranged depending on the number of electrodes 21 and 22. The number of the first banks BNL1 may vary depending on the number of electrodes 21 and 22 and the arrangement of the light emitting elements 30, or the first banks BNL1 may have different shapes to form an island-shaped pattern.

The first bank BNL1 may have a structure in which at least a part thereof protrudes from the upper surface of the first planarization layer 19. The protruding portion of the first bank BNL1 may have an inclined side surface, and the light emitted from the light emitting element 30 may be reflected from the electrodes 21 and 22 disposed on the first bank BNL1 and emitted in an upward direction of the first planarization layer 19. The first bank BNL1 may provide an area in which the light emitting element 30 is disposed, and may function as a reflective barrier that reflects light emitted from the light emitting element 30 in an upward direction. The side surface of the first bank BNL1 may be inclined in a linear shape but is not limited thereto. For example, the first bank BNL1 may have a curved semi-circle or semi-ellipse shape. The first banks BNL1 may include an organic insulating material such as polyimide (PI), but the material thereof is not limited thereto. The first banks BNL1 may be omitted.

Electrodes 21 and 22 may have a shape extending in a direction and may be disposed for each sub-pixel PXn. The electrodes 21 and 22 may extend in the second direction DR2 and may be disposed to be spaced apart from each other in the first direction DR1. For example, the first electrode 21 and the second electrode 22 spaced apart from the first electrode 21 in the first direction DR1 may be disposed in a sub-pixel PXn. However, the disclosure is not limited thereto, and the positions of the electrodes 21 and 22 disposed in each sub-pixel PXn may vary depending on the number thereof or the number of light emitting elements 30 disposed in each sub-pixel PXn.

The first electrode 21 and the second electrode 22 may be disposed in the light emitting area EMA of each sub-pixel PXn, and parts thereof may be disposed to overlap the second bank BNL2 in the thickness direction beyond the light emitting area EMA. The electrodes 21 and 22 may extend in the second direction DR2 within the sub-pixel PXn and may be spaced apart from the electrodes 21 and 22 of another sub-pixel PXn in the second direction DR2 in the cut area CBA.

Each of the first electrode 21 and the second electrode 22 may extend in the second direction DR2 within the sub-pixel PXn and may be separated from other electrodes 21 and 22 in the cut area CBA. For example, the cut area CBA may be disposed between the light emitting areas EMA of the sub-pixels PXn neighboring in the second direction DR2, and the first electrode 21 and the second electrode 22 may be separated from other first and second electrodes 21 and 22 disposed in the sub-pixels PXn neighboring in the second direction DR2 in the cut area CBA. However, the disclosure is not limited thereto. For example, some of the electrodes 21 and 22 may be disposed to extend beyond the sub-pixels PXn neighboring in the second direction DR2 without being separated from each other for each sub-pixel PXn, or only one of the first electrode 21 and the second electrode 22 may be separated.

In the arrangement of the electrodes 21 and 22, electrode lines extending in the second direction DR2 may be formed and then be separated from each other in a subsequent process after the light emitting elements 30 are arranged. The electrode lines may be used to generate an electric field in the sub-pixel PXn in order to align the light emitting elements 30 during the process of manufacturing the display device 10. For example, in case that the light emitting elements 30 are sprayed on the electrode lines through an inkjet printing process and an ink including the light emitting elements 30 is sprayed on the electrode lines, an alignment signal may be applied to the electrode lines to generate an electric field. The light emitting elements 30 dispersed in the ink may be arranged on the electrodes 21 and 22 by receiving a dielectrophoretic force by the generated electric field. After the light emitting elements 30 are arranged, some of the electrode lines may be separated from each other to form electrodes 21 and 22 separated in each sub-pixel PXn.

The electrodes 21 and 22 may be electrically connected to the third conductive layer such that signals for allowing the light emitting element 30 to emit light may be applied. The first electrode 21 may electrically contact the first conductive pattern CDP through a first contact hole CT1 penetrating the third interlayer insulating layer under the first electrode 21. The second electrode 22 may electrically contact the second voltage line VL2 through a second contact hole CT2 penetrating the third interlayer insulating layer under the second electrode 22. The first electrode 21 may be electrically connected to the first transistor T1 through the first conductive pattern CDP to apply a first power voltage, and the second electrode 22 may be electrically connected to the second voltage line VL2 to apply a second power voltage.

The electrodes 21 and 22 may be electrically connected to the light emitting element 30. Each of the electrodes 21 and 22 may be electrically connected to the ends of the light emitting element 30 through the contact electrodes CNE1 and CNE2 to be described below and may transmit an electric signal applied from the third conductive layer to the light emitting element 30. Since the electrodes 21 and 22 are disposed separately in each sub-pixel PXn, the light emitting elements 30 of different sub-pixels PXn may emit light individually.

Although it is illustrated in the drawings that the first contact hole CT1 and the second contact hole CT2 are formed at a position overlapping the second bank BNL2, the disclosure is not limited thereto. For example, each of the contact holes CT1 and CT2 may be located in the light emitting area EMA surrounded by the second bank BNL2.

The electrodes 21 and 22 disposed in each sub-pixel PXn may be disposed on the first banks BNL1 spaced apart from each other. Each of the electrodes 21 and 22 may be disposed on an inclined side surface of the first bank BNL1 in the first direction DR1. In an embodiment, the width of the electrodes 21 and 22 measured in the first direction DR1 may be smaller than the width of the first bank BNL1 measured in the first direction DR1. Each of the electrodes 21 and 22 may be disposed to overlap at least one side of the first bank BNL1 to reflect light emitted from the light emitting element 30.

The distance between the electrodes 21 and 22 spaced apart from each other in the first direction DR1 may be smaller than the distance between the first banks BNL1. Each of the electrodes 21 and 22 may have at least some regions directly disposed on the third interlayer insulating layer such that the electrodes 21 and 22 may be disposed on the same plane or layer.

Each of the electrodes 21 and 22 may include a conductive material having a high reflectance. For example, each of the electrodes 21 and 22 may include a metal such as silver (Ag), copper (Cu), or aluminum (Al) as the conductive material having a high reflectance or may include an alloy containing aluminum (Al), nickel (Ni), or lanthanum (La). Each of the electrodes 21 and 22 may reflect the light emitted from the light emitting element 30 and proceeding to the side surface of the first bank BNL1 in the upward direction of each sub-pixel PXn.

However, the disclosure is not limited thereto, and each of the electrodes 21 and 22 may further include a transparent conductive material. For example, each of the electrodes 21 and 22 may include a material such as indium tin oxide (ITO), indium zinc oxide (IZO), or indium tin zinc oxide (ITZO). In some embodiments, each of the electrodes 21 and 22 may have a structure in which one or more transparent conductive material layers and one or more metal layers having high reflectivity are stacked or may be formed as a layer including them. For example, each of the electrodes 21 and 22 may have a stacked structure of ITO/Ag/ITO/, ITO/Ag/IZO, or ITO/Ag/ITZO/IZO.

The first insulating layer PAS1 may be disposed on the electrodes 21 and 22 and the first bank BNL1. The first insulating layer PAS1 may be disposed to overlap the first banks BNL1 and the first and second electrodes 21 and 22 and may be disposed to expose a part of the upper surface of the first electrode 21 and a part of the upper surface of the second electrode 22. An opening OP may be formed to expose a portion of the upper surfaces of the electrodes 21 and 22 that is disposed on the first bank BNL1, and the contact electrodes CNE1 and CNE2 may electrically contact the electrodes 21 and 22 through the opening OP.

In an embodiment, a step or height difference may be formed in the first insulating layer PAS1 such that a part of the upper surface of the first insulating layer PAS1 is recessed between the first electrode 21 and the second electrode 22. As the first insulating layer PAS1 is disposed to cover or overlap the first electrode 21 and the second electrode 22, the first insulating layer PAS1 may have a height difference between the first electrode 21 and the second electrode 22. However, the disclosure is not limited thereto. The first insulating layer PAS1 may protect the first electrode 21 and the second electrode 22 and insulate them from each other. Further, the first insulating layer PAS1 may prevent the light emitting element 30 disposed on the first insulating layer PAS1 from being damaged by direct contact with other members.

A second bank BNL2 may be disposed on the first insulating layer PAS1. The second bank BNL2 may be disposed in a lattice pattern on the entire surface of the display area DPA while including portions extending in the first direction DR1 and the second direction DR2 on a plane (or a layer). The second bank BNL2 may be disposed over the boundary between the respective sub-pixels PXn to distinguish neighboring sub-pixels PXn. Further, the second bank BNL2 may be disposed to surround the light emitting area EMA and the cut area CBA disposed in each sub-pixel PXn to distinguish the light emitting area EMA and the cut area CBA. In the portion of the second bank BNL2 extending in the second direction DR2, the portion disposed between the light emitting areas EMA may have a greater width than the portion disposed between the cut areas CBA.

Accordingly, the distance between the cut areas CBA may be smaller than the distance between the light emitting areas EMA.

The second bank BNL2 may be formed to have a height greater than that of the first bank BNL1. The second bank BNL2 may prevent ink from overflowing to adjacent sub-pixels PXn in an inkjet printing process of the process of manufacturing the display device 10, so that inks in which different light emitting elements 30 are dispersed for each pixel PXn may be separated from each other and not be mixed with each other. Similar to the first bank BNL1, the second bank BNL2 may include polyimide (PI), but the material thereof is not limited thereto.

The light emitting element 30 may be disposed on the first insulating layer PAS1. The light emitting elements 30 may be arranged to be spaced apart from each other in the second direction DR2 in which the electrodes 21 and 22 extend and may be aligned substantially parallel to each other. The light emitting element 30 may have a shape extending in a direction. The direction in which each of the electrodes 21 and 22 extends may be substantially perpendicular to the direction in which the light emitting element 30 extends. However, the disclosure is not limited thereto. For example, the light emitting element 30 may be disposed obliquely at a predetermined angle such that it does not extend perpendicular to the direction in which each of the electrodes 21 and 22 extends.

The light emitting element 30 may include semiconductor layers doped with different conductivity types of dopants. The light emitting element 30 may include semiconductor layers and may be aligned such that an end of the light emitting element 30 faces in a specific direction according to the direction of an electric field generated on the electrodes 21 and 22. The light emitting element 30 may include a light emitting layer 36 (see FIG. 4) to emit light of a specific wavelength band. The light emitting elements 30 disposed in each sub-pixel PXn may emit light of different wavelength bands according to a material forming the light emitting layer 36. However, the disclosure is not limited thereto. For example, the light emitting elements 30 disposed in each of the sub-pixels PXn may emit light of the same color.

The light emitting element 30 may be provided with layers in a direction perpendicular to the upper surface of the first substrate 11. The light emitting element 30 of the display device 10 may be disposed such that an extending direction thereof is parallel to the upper surface of the first substrate 11, and the semiconductor layers included in the light emitting element 30 may be sequentially arranged in a direction parallel to the upper surface of the first substrate 11. However, the disclosure is not limited thereto. In some cases, in case that the light emitting element 30 has a different structure, the semiconductor layers may be arranged in a direction perpendicular to the upper surface of the first substrate 11.

The light emitting element 30 may be disposed on each of the electrodes 21 and 22 between the first banks BNL1. For example, the light emitting element 30 may be disposed such that one end thereof is placed on the first electrode 21 and the other end thereof is placed on the second electrode 22. The elongated length of the light emitting element 30 may be greater than the distance between the first electrode 21 and the second electrode 22, and both ends of the light emitting element 30 may be disposed on the first electrode 21 and the second electrode 22.

Both ends of the light emitting element 30 may electrically contact the contact electrodes CNE1 and CNE2, respectively. Since the light emitting element 30 may not be provided with an insulating film 38 (see FIG. 4) on an end surface in a direction, and a part of the semiconductor layer may be exposed, the exposed semiconductor layer may contact the contact electrodes CNE1 and CNE2. However, the disclosure is not limited thereto. In some cases, at least a part of the insulating film 38 may be removed, so that side surfaces of ends of the semiconductor layers may be partially exposed. The exposed side surfaces of the semiconductor layers may directly contact the contact electrodes CNE1 and CNE2.

The second insulating layer PAS2 may be partially disposed on the first insulating layer PAS1 and the light emitting element 30. For example, the second insulating layer PAS2 may be disposed to partially surround the outer surface of the light emitting element 30 not to cover or overlap the end and the other end of the light emitting element 30. The shape of the second insulating layer PAS2 may be formed by a process of entirely placing the second insulating layer PAS2 on the first insulating layer PAS1 and then removing the second insulating layer PAS2 to expose both ends of the light emitting element 30 during the process of manufacturing the display device 10.

A portion of the second insulating layer PAS2 disposed on the light emitting element 30 may be disposed to extend in the second direction DR2 on the first insulating layer PAS1 on the plane (or layer), thereby forming a linear or island-shaped pattern in each sub-pixel PXn. The second insulating layer PAS2 may protect the light emitting element 30 and fix the light emitting element 30 in the process of manufacturing the display device 10. The second insulating layer PAS2 may be disposed to fill the space between the light emitting element 30 and the first insulating layer PAS1 under the light emitting element 30.

The contact electrodes CNE1 and CNE2 and the third insulating layer PAS3 may be disposed on the second insulating layer PAS2. The first contact electrode CNE1 and the second contact electrode CNE2 of the contact electrodes CNE1 and CNE2 may be disposed on a part of the first electrode 21 and a part of the second electrode 22, respectively. The first contact electrode CNE1 may be disposed on the first electrode 21, the second contact electrode CNE2 may be disposed on the second electrode 22, and each of the first contact electrode CNE1 and the second contact electrode CNE2 may have a shape extending in the second direction DR2. The first contact electrode CNE1 and the second contact electrode CNE2 may be spaced apart from each other in the first direction DR1 and may form a linear pattern in the light emitting area EMA of each sub-pixel PXn.

Each of the contact electrodes CNE1 and CNE2 may electrically contact the light emitting element 30 and the electrodes 21 and 22. In the light emitting element 30, a semiconductor layer is exposed on both end surfaces in an extending direction, and the first contact electrode CNE1 and the second contact electrode CNE2 may electrically contact the light emitting element 30 on the end surface where the semiconductor layer is exposed. The end of the light emitting element 30 may be electrically connected to the first electrode 21 through the first contact electrode CNE1, and the other end thereof may be electrically connected to the second electrode 22 through the second contact electrode CNE2.

Although it is shown in the drawings that a first contact electrode CNE1 and a second contact electrode CNE2 are disposed in a sub-pixel PXn, the disclosure is not limited thereto. The numbers of first and second contact electrodes CNE1 and CNE2 may be changed depending on the numbers of electrodes 21 and 22 disposed in each sub-pixel PXn.

The contact electrodes CNE1 and CNE2 may include a conductive material. For example, the contact electrodes CNE1 and CNE2 may include ITO, IZO, ITZO, or aluminum (Al). The light emitted from the light emitting element 30 may pass through the contact electrodes CNE1 and CNE2 and proceed toward the electrodes 21 and 22. However, the disclosure is not limited thereto.

The third insulating layer PAS3 may be disposed between the first contact electrode CNE1 and the second contact electrode CNE2. The third insulating layer PAS3 may also be disposed on the first contact electrode CNE1 and the second insulating layer PAS2, except for an area where the second contact electrode CNE2 is disposed. The third insulating layer PAS3 may insulate the first contact electrode CNE1 and the second contact electrode CNE2 from each other such that they do not directly contact each other. For example, in an embodiment, the first contact electrode CNE1 and the second contact electrode CNE2 may be disposed on different layers. The first contact electrode CNE1 may be directly disposed on the second insulating layer PAS2, and the second contact electrode CNE2 may be disposed directly on the third insulating layer PAS3.

Although the third insulating layer PAS3 is disposed between the first contact electrode CNE1 and the second contact electrode CNE2 to insulate them from each other, as described above, the third insulating layer PAS3 may be omitted. In this case, the first contact electrode CNE1 and the second contact electrode CNE2 may be disposed on the same layer.

A fourth insulating layer PAS4 may be entirely disposed on the display area DPA of the first substrate 11. The fourth insulating layer PAS4 may function to protect members disposed on the first substrate 11 from external environments. However, the fourth insulating layer PAS4 may be omitted.

Each of the above-described first insulating layer PAS1, second insulating layer PAS2, third insulating layer PAS3, and fourth insulating layer PAS4 may include an inorganic insulating material or an organic insulating material. For example, each of the first insulating layer PAS1, the second insulating layer PAS2, the third insulating layer PAS3, and the fourth insulating layer PAS4 may include an inorganic insulating layer such as silicon oxide ($SiO_x$), silicon nitride ($SiN_x$), silicon oxynitride ($SiO_xN_y$), aluminum oxide ($Al_2O_3$), or aluminum nitride ($AlN_x$). As another example, each of the first insulating layer PAS1, the second insulating layer PAS2, the third insulating layer PAS3, and the fourth insulating layer PAS4 may include an organic insulating layer such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the disclosure is not limited thereto.

Figure 4:
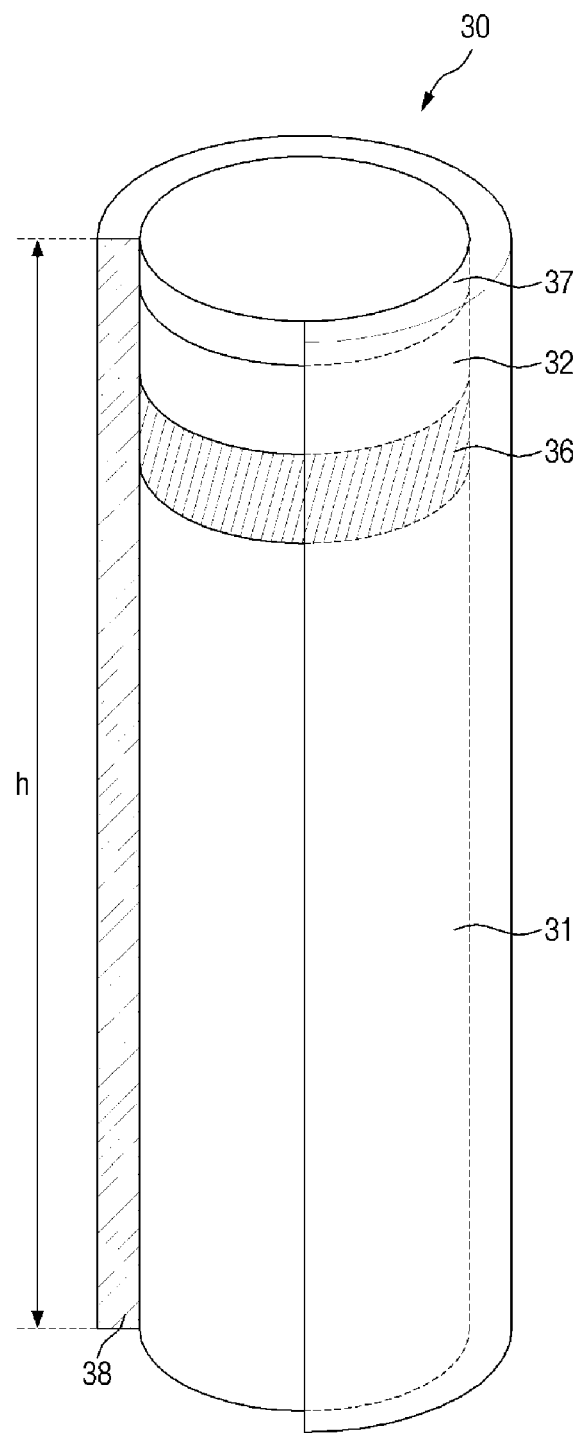
FIG. 4 is a schematic perspective view of a light emitting element according to an embodiment.

FIG. 4 is a schematic perspective view of a light emitting element according to an embodiment.

The light emitting element 30 may be a light emitting diode. Specifically, the light emitting element 30 may be an inorganic light emitting diode having a size of a micrometer or a nanometer and made of an inorganic material. In case that an electric field is formed between two electrodes facing each other in a predetermined direction, the organic light emitting diode may be aligned between the two electrodes having polarities. The light emitting element 30 may be aligned between the two electrodes by the electric field formed on the two electrodes.

The light emitting element 30 may have a shape extending in a direction. The light emitting element 30 may have a shape of a cylinder, a rod, a wire, or a tube. However, the shape of the light emitting element 30 is not limited thereto, and the light emitting element 30 may have various shapes such as a cube, a cuboid, and a hexagonal column, or may have a shape extending in a direction and having a partially inclined outer surface. Semiconductors included in the light emitting element 30 to be described below may be sequentially arranged or stacked in a direction.

The light emitting element 30 may include semiconductor layers doped with impurities of any conductive type (for example, p-type or n-type). The semiconductor layers may receive an electrical signal applied from an external power source and emit light of a specific wavelength band.

Referring to FIG. 4, the light emitting element 30 may include a first semiconductor layer 31, a second semiconductor layer 32, a light emitting layer 36, an electrode layer 37, and an insulating film 38.

The first semiconductor layer 31 may be an n-type semiconductor layer. In case that the light emitting element 30 emits light of a blue wavelength band, the first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the semiconductor material may be at least one of AlGaInN, GaN, AlGaN, InGaN, AlN, and InN, each being doped with n-type impurities. The first semiconductor layer 31 may be doped with an n-type dopant. The n-type dopant may be Si, Ge, or Sn. For example, the first semiconductor layer 31 may be n-GaN doped with n-type Si. The length of the first semiconductor layer 31 may be in a range of about 1.5 μm to about 5 μm but is not limited thereto.

The second semiconductor layer 32 may be disposed on the light emitting layer 36 to be described below. The second semiconductor layer 32 may be a p-type semiconductor layer. In case that the light emitting element 30 emits light of a blue wavelength band or a green wavelength band, the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the semiconductor material may be at least one of AlGaInN, GaN, AlGaN, InGaN, AlN, and InN, each being doped with p-type impurities. The second semiconductor layer 32 may be doped with a p-type dopant. The p-type dopant may be Mg, Zn, Ca, Se, or Ba. For example, the second conductive semiconductor 320 may be p-GaN doped with p-type Mg. The length of the second semiconductor layer 32 may be in a range of about 0.05 μm to about 0.10 μm but is not limited thereto.

Although it is shown in FIG. 4 that each of the first semiconductor layer 31 and the second semiconductor layer 32 is formed as a layer, the disclosure is not limited thereto. Each of the first semiconductor layer 31 and the second semiconductor layer 32 may further include a larger number of layers, for example, clad layers or tensile strain barrier reducing (TSBR) layers according to the material of the light emitting layer 36.

The light emitting layer 36 may be disposed between the first semiconductor layer 31 and the second semiconductor layer 32. The light emitting layer 36 may include a material of a single or multiple quantum well structure. In case that the light emitting layer 36 includes a material of a multiple quantum well structure, the light emitting layer 36 may have a structure in which quantum layers and well layers are alternately stacked. The light emitting layer 36 may emit light by the combination of electron-hole pairs according to an electrical signal applied through the first semiconductor layer 31 and the second semiconductor layer 32. In case that the light emitting layer 36 emits light of a blue wavelength band, the light emitting layer 36 may include a material such as AlGaN or AlGaInN. In particular, in case that the light emitting layer 36 has a multiple quantum well structure in which quantum layers and well layers are alternately stacked, the quantum wells may include a material such as AlGaN or AlGaInN, and the well layers may include a material such as GaN or AlInN. For example, the light emitting layer 36 may include quantum wells each containing AlGaInN and well layers each containing AlInN, and thus the light emitting layer 36 may emit blue light having a central wavelength band of about 450 nm to about 495 nm as described above.

However, the disclosure is not limited thereto, and the light emitting layer 36 may have a structure in which semiconductor materials having a high bandgap energy and semiconductor materials having a low bandgap energy are alternately stacked and may include other group III to group V semiconductor materials depending on the wavelength band of light. The light emitted from the light emitting layer 36 is not limited to light of a blue wavelength band, and in some cases, the light emitting layer 36 may emit light of a red or green wavelength band. The length of the light emitting layer 36 may be in a range of about 0.05 μm to about 0.10 μm but is not limited thereto.

The light emitted from the light emitting layer 36 may be emitted to both side surfaces of the light emitting element 30 as well as the longitudinal outer surface of the light emitting element 30. The direction of the light emitted from the light emitting layer 36 is not limited to a direction.

The electrode layer 37 may be an ohmic contact electrode. However, the disclosure is not limited thereto, and the electrode layer 37 may be a Schottky contact electrode. The light emitting element 30 may include at least one electrode layer 37. Although it is shown in FIG. 4 that the light emitting element 30 includes an electrode layer 37, the disclosure is not limited thereto. In some cases, the light emitting element 30 may include a larger number of electrode layers 37, or the electrode layer 37 may be omitted. A description of the light emitting element 30 to be described below may be equally applied even if the number of electrode layers 37 is changed or the light emitting element 30 further includes other structures.

In case that the light emitting element 30 is electrically connected to an electrode or a contact electrode in the display device 10 according to an embodiment, the electrode layer 37 may reduce the resistance between the light emitting element 30 and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 37 may include a semiconductor material doped with n-type or p-type impurities. However, the disclosure is not limited thereto.

The insulating film 38 may be disposed to surround the outer surfaces of the above-described semiconductor layers and electrode layers. For example, the insulating film 38 may be disposed to surround at least the outer surface of the light emitting layer 36 and may extend in a direction in which the light emitting element 30 extends. The insulating film 38 may function to protect the members. For example, the insulating film 38 may be formed to surround the side surfaces of the members and may be formed such that both ends of the light emitting element 30 in a length direction are exposed.

Figure 5:
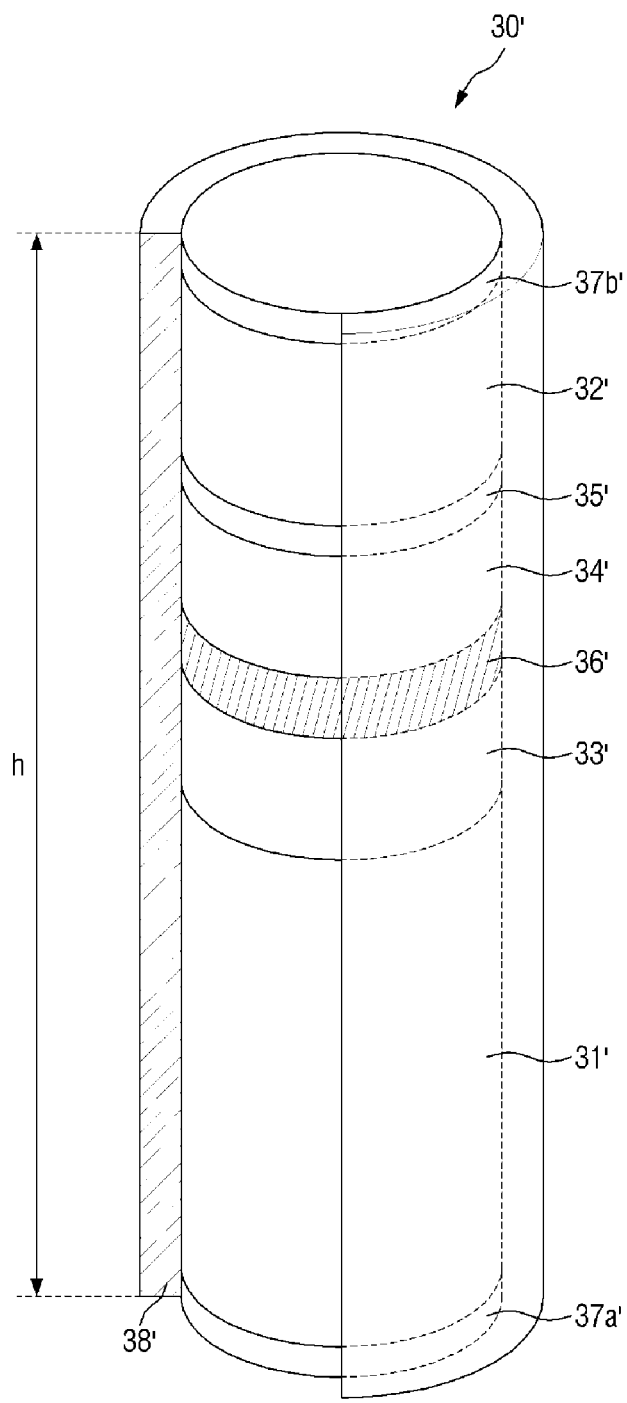
FIGS. 5 and 6 are schematic perspective views of light emitting elements according to other embodiments.

Although it is shown in FIG. 5 that the insulating film 38 may extend in the length direction of the light emitting element 30 to cover or overlap the first semiconductor layer 31 to the side surface of the electrode layer 37, the disclosure is not limited thereto. The insulating film 38 may overlap only the outer surface of a part of the semiconductor layer as well as the active layer 330 or overlap only a part of the outer surface of the electrode layer 37 to expose a part of the outer surface of the electrode layer 37. The insulating film 38 may be formed to have a rounded cross-sectional upper surface in an area adjacent to at least one end of the light emitting element 30.

The thickness of the insulating film 38 may be in a range of about 10 nm to about 1.0 μm but is not limited thereto. The thickness of the insulating film 38 may be about 40 nm.

The insulating film 38 may include a material having insulating properties, for example, silicon oxide ($SiO_x$), silicon nitride ($SiN_x$), silicon oxynitride ($SiO_xN_y$), aluminum nitride ($AlN_x$), or aluminum oxide ($AlO_x$). Thus, the light emitting layer 36 may prevent an electrical short that may occur in case that the light emitting layer 36 is directly contact an electrode through which an electrical signal is transmitted to the light emitting element 30. Further, since the insulating film 380 protects the outer surface of the light emitting element 30 as well as the light emitting layer 36, it is possible to prevent the deterioration in light emission efficiency.

Further, the outer surface of the insulating film 38 may be surface-treated. The light emitting elements 30 may be aligned by being sprayed onto the electrodes in a state in which they are dispersed in a predetermined ink. Here, the surface of the insulating film 38 may be hydrophobically or hydrophilically treated in order to maintain the light emitting elements 30 in a dispersed state without being aggregated with other adjacent light emitting elements 30 in the ink. For example, the outer surface of the insulating film 38 may be surface-treated with a material such as stearic acid or 2,3-naphthalene dicarboxylic acid.

The length h of the light emitting element 30 may be in a range of about 1 μm to about 10 μm, about 2 μm to about 6 μm, or about 3 μm to about 5 μm. The diameter of the light emitting element 30 may be in a range of about 30 nm to about 700 nm, and the aspect ratio of the light emitting element 30 may be in a range of about 1.2 to about 100. However, the disclosure is not limited thereto, and the light emitting elements 30 included in the display device 10 may have different diameters according to the composition difference of the light emitting layer 36. For example, the diameter of the light emitting element 30 may be about 500 nm.

The shape and material of the light emitting element 30 is not limited to those of FIG. 4. In some embodiments, light emitting element 30 may include a larger number of layers or may have a different shape.

Figure 6:
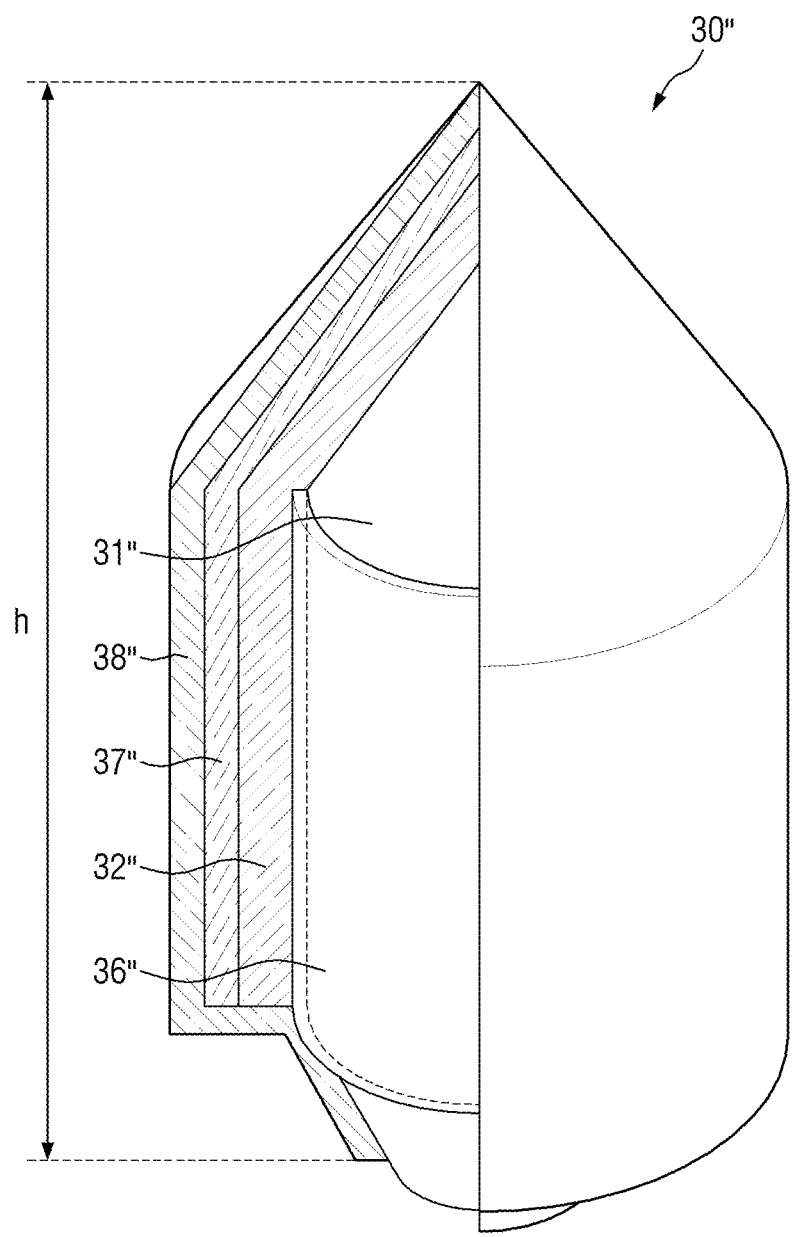

FIGS. 5 and 6 are schematic perspective views of light emitting elements according to other embodiments.

First, referring to FIG. 5, a light emitting element 30' according to an embodiment may further include a third semiconductor layer 33' disposed between a first semiconductor layer 31' and a light emitting layer 36', a fourth semiconductor layer 34' and a fifth semiconductor layer 35' disposed between a light emitting layer 36' and a second semiconductor layer 32', and an insulating film 38'. The light emitting element 30' of FIG. 5 may be different from the light emitting element 30 of FIG. 4 at least in that the semiconductor layers 33', 34', 35' and electrode layers 37a' and 37b' are further provided, and the light emitting layer 36' includes different elements. Hereinafter, repetitive descriptions thereof will be omitted, and differences therebetween will be mainly described.

In the light emitting element 30 of FIG. 4, the light emitting layer 36 may include nitrogen (N) to emit blue or green light. In contrast, in the light emitting element 30' of FIG. 5, the light emitting layer 36' and other semiconductor layers may be semiconductor layers each including at least phosphorus (P). The light emitting element 30' according to an embodiment may emit red light having a center wavelength band in a range of about 620 nm to about 750 nm. However, it should be understood that the central wavelength band of red light is not limited to the above-described range and may include all wavelength ranges that can be recognized as red in the art.

Specifically, the first semiconductor layer 31' may be an n-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). The first semiconductor layer 31' may include at least one of InAlGaP, GaP, AlGaP, InGaP, AlP, and InP, which are doped with n-type impurities. For example, the first semiconductor layer 31' may include n-AlGaInP doped with n-type Si.

The second semiconductor layer 32' may be a p-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). The second semiconductor layer 32' may include at least one of InAlGaP, GaP, AlGaNP, InGaP, AlP, and InP, which are doped with p-type impurities. For example, the second semiconductor layer 32' may include p-GaP doped with p-type Mg.

The light emitting layer 36' may be disposed between the first semiconductor layer 31' and the second semiconductor layer 32'. The light emitting layer 36' may include a material having a single or multiple quantum well structure to emit light of a specific wavelength band. In case that the light emitting layer 36' has a multiple quantum well structure in which quantum layers and well layers are alternately stacked, the quantum layer may include a material such as AlGaP or AlInGaP, and the well layer may include a material such as GaP or AlInP. For example, the light emitting layer 36' may include the quantum layer including AlGaInP and the well layer including AlInP to emit red light having a central wavelength band of about 620 nm to about 750 nm.

The light emitting element 30' of FIG. 5 may include a clad layer disposed adjacent to the light emitting layer 36'. As shown in FIG. 5, the third semiconductor layer 33' and the fourth semiconductor layer 34' disposed between the first semiconductor layer 31' and the second semiconductor layer 32' and disposed on and beneath the light emitting layer 36' may be clad layers.

The third semiconductor layer 33' may be disposed between the first semiconductor layer 31' and the light emitting layer 36'. Similar to the first semiconductor layer 31', the third semiconductor layer 33' may be an n-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the first semiconductor layer 31' may include n-AlGaInP, and the third semiconductor layer 33' may include n-AlInP.

The fourth semiconductor layer 34' may be disposed between the light emitting layer 36' and the second semiconductor layer 32'. Similar to the second semiconductor layer 32', the fourth semiconductor layer 34' may be a p-type semiconductor layer and may include a semiconductor material having a chemical formula of $In_xAl_yGa_{1-x-y}P$ ($0 \leq x \leq 1$, $0 \leq y \leq 1$, $0 \leq x+y \leq 1$). For example, the second semiconductor layer 32' may include p-GaP, and the fourth semiconductor layer 34' may include p-AlInP.

The fifth semiconductor layer 35' may be disposed between the fourth semiconductor layer 34' and the second semiconductor layer 32'. Similar to the second semiconductor layer 32' and the fourth semiconductor layer 34', the fifth semiconductor layer 35' may be a p-type semiconductor layer. In some embodiments, the fifth semiconductor layer 35' may function to reduce a difference in lattice constant between the fourth semiconductor layer 34' and the second semiconductor layer 32'. The fifth semiconductor layer 35' may be a tensile strain barrier reducing (TSBR) layer. For example, the fifth semiconductor layer 35' may include p-GaInP, p-AlInP, or p-AlGaInP, but the material thereof is not limited thereto. The length of each of the third semiconductor layer 33', the fourth semiconductor layer 34', and the fifth semiconductor layer 35' may be in a range of about 0.08 μm to about 0.25 μm but is not limited thereto.

The first electrode layer 37a' and the second electrode layer 37b' may be disposed on the first semiconductor layer 31' and the second semiconductor layer 32', respectively. The first electrode layer 37a' may be disposed on the lower surface of the first semiconductor layer 31', and the second electrode layer 37b' may be disposed on the upper surface of the second semiconductor layer 32'. However, the disclosure is not limited thereto, and at least one of the first electrode layer 37a' and the second electrode layer 37b' may be omitted. For example, in the light emitting element 30', the first electrode layer 37a' may not be disposed on the lower surface of the first semiconductor layer 31', and only one second electrode layer 37b' may be disposed on the upper surface of the second semiconductor layer 32'.

Subsequently, referring to FIG. 6, a light emitting element 30" may 30" may have a shape extending in a direction, but may have a partially inclined side surface. For example, the light emitting element 30" according to an embodiment may have a partially conical shape.

The light emitting element 30" may be formed such that layers are not stacked in a direction and each layer surrounds the outer surface of another layer. The light emitting element 30" may include a semiconductor core having at least some regions extending in a direction and an insulating film 38" formed to surround the semiconductor core. The semiconductor core may include a first semiconductor layer 31", a light emitting layer 36", a second semiconductor layer 32", and an electrode layer 37".

The first semiconductor layer 31" may extend in a direction, and both end portions thereof may be formed to be inclined toward the centers thereof. The first semiconductor layer 31" may include a body portion having a rod shape or a cylindrical shape, and upper and lower end portions having inclined side surfaces and respectively formed on and under the body portion. The upper end portion of the body portion may have a slope steeper than the lower end portion.

The light emitting layer 36" may disposed to surround the outer surface of the body portion of the first semiconductor layer 31". The light emitting layer 36" may have an annular shape extending in a direction. The light emitting layer 36" may not be formed on the upper and lower end portions of the first semiconductor layer 31". However, the disclosure is not limited thereto. The light emitted from the light emitting layer 36" may be emitted to both side surfaces of the light emitting element 30" in a length direction as well as to both ends of the light emitting element 30" in the length direction.

Compared to the light emitting element 30 of FIG. 4, the light emitting element 30" of FIG. 6 may include the light emitting layer 36" having a large area and may thus emit a larger amount of light.

The second semiconductor layer 32" may be disposed to surround the outer surface of the light emitting layer 36" and the upper end portion of the first semiconductor layer 31". The second semiconductor layer 32" may include an annular body portion extending in a direction and an upper end portion having an inclined side surface. For example, the second semiconductor layer 32" may directly contact the parallel side surface of the light emitting layer 36" and the inclined upper end portion of the first semiconductor layer 31". However, the second semiconductor layer 32" is not formed on the lower end portion of the first semiconductor layer 31".

The electrode layer 37" may be disposed to surround the outer surface of the second semiconductor layer 32". The shape of the electrode layer 37" may be substantially identical to the shape of the second semiconductor layer 32". The electrode layer 37" may entirely contact the outer surface of the second semiconductor layer 32".

The insulating film 38" may be disposed to surround the outer surfaces of the electrode layer 37" and the first semiconductor layer 31". The insulating film 38" may directly contact the lower end portion of the first semiconductor layer 31" and the exposed lower portions of the light emitting layer 36" and the second semiconductor layer 32" as well as the electrode layer 37".

The light emitting elements 30 may be sprayed onto each of the electrodes 21 and 22 by an inkjet printing process. The light emitting elements 30 may be dispersed in a solvent to be prepared in an ink state and sprayed onto the electrodes 21 and 22 and may be disposed between the electrodes 21 and 22 by a process of applying an alignment signal to the electrodes 21 and 22. In case that an alignment signal is applied to each of the electrodes 21 and 22, an electric field may be formed thereon, and the light emitting element 30 may receive a dielectrophoretic force by the electric field. The light emitting element 30 having received the dielectrophoretic force may be disposed on the first electrode 21 and the second electrode 22 while the alignment direction and position of the light emitting element 30 are changed.

The light emitting element 30 may include semiconductor layers and may be generally made of (or include) a material having a specific gravity greater than that of a solvent. When the light emitting elements 30 are dispersed and stored in a solvent, the dispersion may be maintained for a predetermined period of time and then be gradually precipitated because of the difference in specific gravity. When the light emitting elements 30 are precipitated in the solvent, the number of light emitting elements 30 per ink droplet is not uniform. Therefore, when a device including the light emitting element 30 is manufactured using the ink, the number of light emitting elements 30 for each area is not constant, and thus the quality of products may be deteriorated.

According to an embodiment, the ink including the light emitting elements 30 may further include a thickener 500 (see FIG. 7), and thus viscosity of the ink may change according to the temperature of the solution. The ink including the light emitting elements 30 may have a high viscosity in a state in which the ink is stored in a container, or at room temperature, and thus the light emitting elements 30 may be stored in a dispersed state for a long time. Further, in case that the ink including the light emitting elements 30 is discharged through a nozzle in an inkjet printing process, the temperature of a nozzle of an inkjet printing apparatus may be adjusted to reduce the viscosity of the ink, and thus the ink may be readily discharged through the nozzle. Therefore, according to an embodiment, the ink including the light emitting elements 30 may be sprayed by including a uniform number of light emitting elements 30 in a unit area by a printing process while preventing precipitation of the light emitting element 30. Hereinafter, the ink including the light emitting elements 30 will be described.

Figure 7:
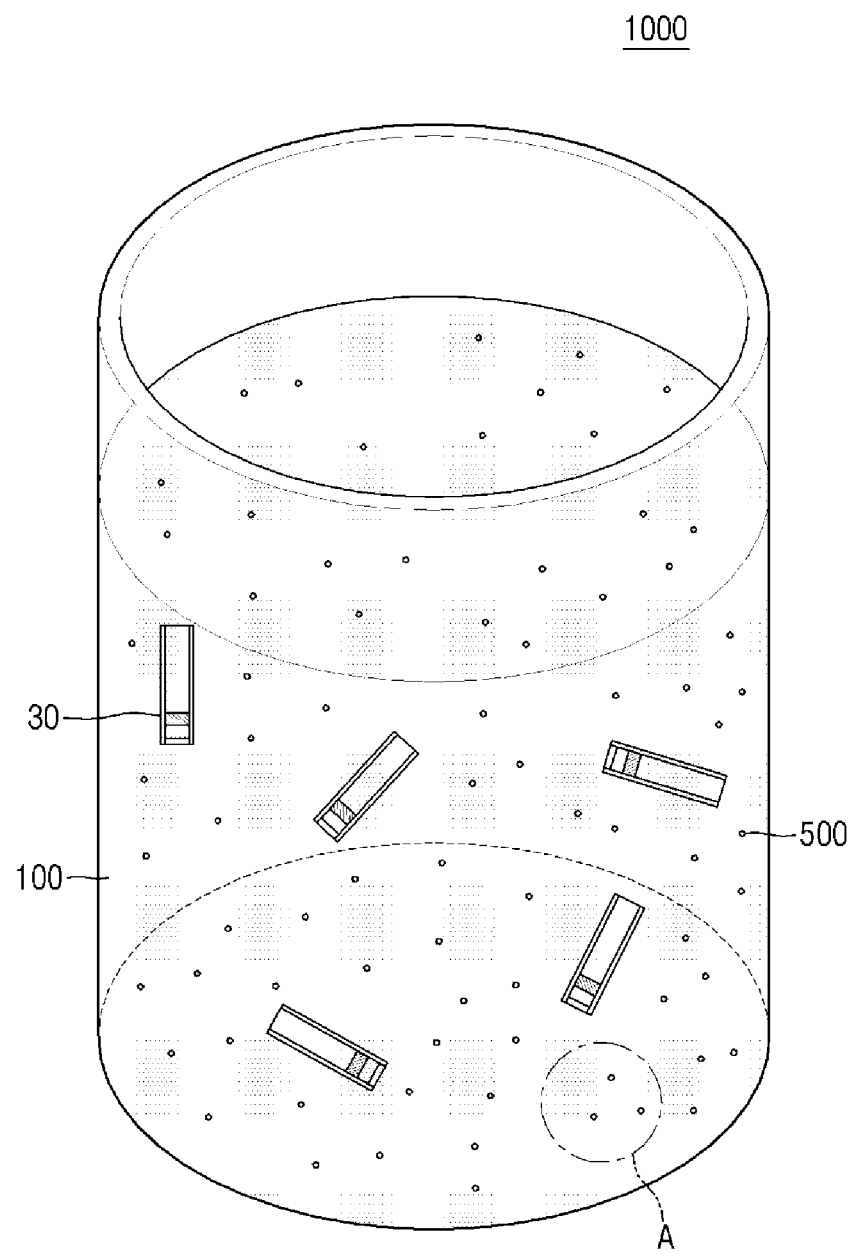
FIG. 7 is a schematic perspective view of a light emitting element ink according to an embodiment.

FIG. 7 is a schematic perspective view of a light emitting element ink according to an embodiment.

Referring to FIG. 7, a light emitting element ink 1000 according to an embodiment may include a light emitting element solvent 100, light emitting elements 30 dispersed in the light emitting element solvent 100, and thickeners 500. The light emitting element 30 may be one of the light emitting elements 30, 30', and 30" described above with reference to FIGS. 4 to 6, and the light emitting element 30 of FIG. 4 is illustrated in the drawings. Since the description of the light emitting element 30 is the same as that described above, the light emitting element solvent 100 and the thickener 500 will be described in detail below.

The light emitting element solvent 100 may store the light emitting elements 30 having a high specific gravity, including semiconductor layers, in a dispersed state, and may be an organic solvent that does not react with the light emitting elements 30. The light emitting element solvent 100 may have a viscosity sufficient to be discharged through a nozzle of an inkjet printing apparatus in a liquid state. The solvent molecules of the light emitting element solvent 100 may disperse the light emitting elements 30 while surrounding the surfaces of the light emitting elements 30. The light emitting element ink 1000 may include the light emitting elements 30 to be prepared in a solution or colloid state. In an embodiment, examples of the light emitting element solvent 100 may include, but are not limited to, acetone, water, alcohol, toluene, propylene glycol (PG) or propylene glycol methyl acetate (PGMA), triethylene glycol monobutyl ether (TGBE), diethylene glycol monophenyl ether (DGPE), amide-based solvents, dicarbonyl-based solvents, diethylene glycol dibenzoate, tricarbonyl-based solvents, triethyl citrate, phthalate-based solvents, benzyl butyl phthalate, bis(2-ethylhexyl) phthalate, bis(2-ethylhexyl) isophthalate, bis(2-ethylhexyl) isophthalate, and ethylphthalyl ethyl glycolate. Examples of more various light emitting element solvents 100 will be described below.

In the specification, the term "light emitting element solvent 100" refers to a solvent in which the light emitting elements 30 may be dispersed, or a medium thereof, and the term "solvent molecule 101" refers to a molecule that is included in the light emitting element solvent 100. For example, it may be understood that the term "light emitting element solvent 100" is a liquid solvent including the solvent molecules 101. However, these terms may not necessarily be used separately, and in some cases, the terms "light emitting element solvent 100" and "solvent molecule 101" are used interchangeably but may be substantially the same.

The thickeners 500 may be dispersed in the light emitting element solvent 100 together with the light emitting elements 30. A predetermined amount of the thickeners 500 may be included in the light emitting element ink 1000 to change the viscosity of the solution according to the temperature of the light emitting element ink 1000. According to an embodiment, the thickener 500 may be a polyol-based compound including a functional group capable of forming a hydrogen bond. The thickener 500 may form a hydrogen bond between the solvent molecules 101 or the thickeners 500 of the light emitting element solvent 100 to form a relatively strong attraction force between different molecules.

Figure 8:
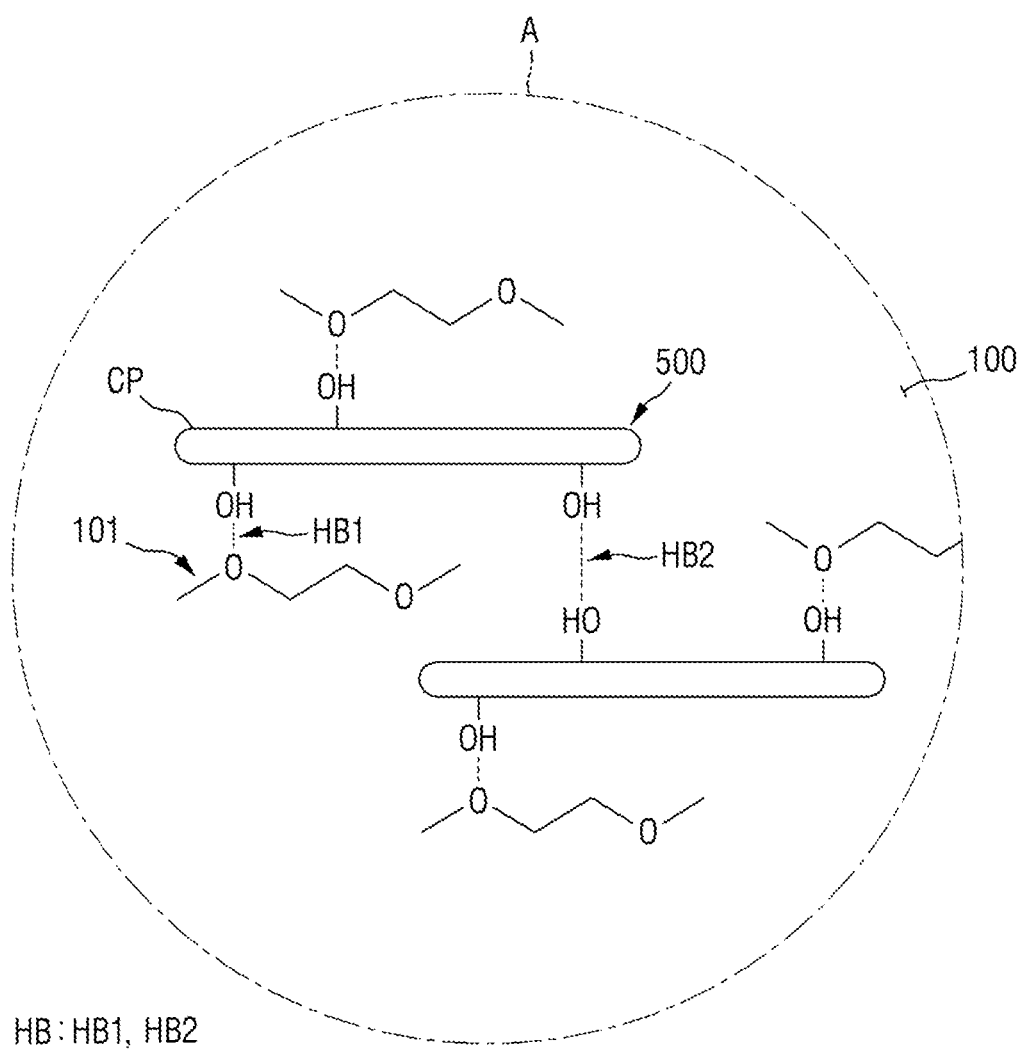
FIG. 8 is a schematic diagram illustrating an intermolecular bond between a thickener and a light emitting element solvent in the light emitting element ink of FIG. 7 at room temperature.

FIG. 8 is a schematic diagram illustrating an intermolecular bond between a thickener and a light emitting element solvent in the light emitting element ink of FIG. 7 at room temperature. FIG. 8 is an enlarged view of area A of FIG. 7 and illustrates the form of a molecule of the thickener 500 dispersed in the light emitting element solvent 100 in a state of the light emitting element ink 1000 is stored at room temperature or 25° C. In the specification, the term "room temperature" generally refers to about 25° C., but may refer to a temperature around the same, including 25° C. For example, the term "room temperature" may include a temperature in a range of about 20° C. to about 30° C.

Referring to FIG. 8, the thickener 500 may include a hydroxyl group (—OH) as a polyol-based compound capable of forming a hydrogen bond. The thickener 500 may include a main chain portion CP to which at least one hydroxyl group (—OH) is bonded. The main chain portion CP may be a carbon chain such as an alkyl group, an alkenyl group, or an alkynyl group, but is not limited thereto, and may further include other functional groups such as an ether group (—O—). In a thickener 500, the hydroxyl group (—OH) may form a hydrogen bond HB with a solvent molecule 101 of the light emitting element solvent 100 or an atom, for example, oxygen (O) or nitrogen (N), having a non-covalent electron pair of the hydroxyl group (—OH) of another thickener 500. According to an embodiment, the thickener 500 may form a hydrogen bond with a molecule of another thickener 500 or the solvent molecule 101 and may form a network structure between the main chain portion CP and the solvent molecule 101 and between the main chain portions CP of other thickeners 500 at the room temperature of about 25° C. The light emitting element ink 1000 may have a high viscosity because of the network structure formed by the thickeners 500, and the precipitation rate of the light emitting elements 30 may decrease in a state in which the light emitting element ink 1000 is stored.

For example, the light emitting element ink 1000 may have a viscosity in a range of about 30 cP to about 300 cP, measured at the room temperature (about 25° C.). In order to prevent the precipitation of the light emitting elements 30, the light emitting element ink 1000 may have a viscosity of at least about 20 cP or greater in a state in which no shear stress is applied. In the light emitting element ink 1000, the light emitting elements 30 may be kept in a dispersed state for a long time until a printing process using an inkjet printing apparatus. However, the disclosure is not limited thereto. The viscosity of the light emitting element ink 1000 may be adjusted within the range of 20 Cp or greater through the molecular structure and molecular weight of the thickener 500.

According to an embodiment, in the thickener 500 of the light emitting element solvent 1000, the main chain portion CP to which at least one hydroxyl group (—OH) is bonded may be a substituted or unsubstituted alkyl group, alkene group, alkenyl group, or alkyl ether group, having 2 or more carbon atoms.

In some embodiments, the thickener 500 of the light emitting element ink 1000 may include a structure represented by Chemical Structural Formula 1 below.

[Chemical Structural Formula 1]

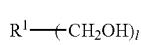

In Chemical Structural Formula 1 above, $R^1$ may be a linear or branched alkyl group or alkyl ether having 1 to 3,000 carbon atoms, which is substituted with a hydroxyl group (—OH) or is unsubstituted, and I may be an integer of 1 to 10. The thickener 500, which is a polyol-based compound, may form a hydrogen bond with the light emitting element solvent 100, and the light emitting element ink 1000 may have a specific viscosity and boiling point.

In an embodiment, the thickener 500 of the light emitting element ink 1000 may be a compound represented by one of Formulas 1 to 8 below.

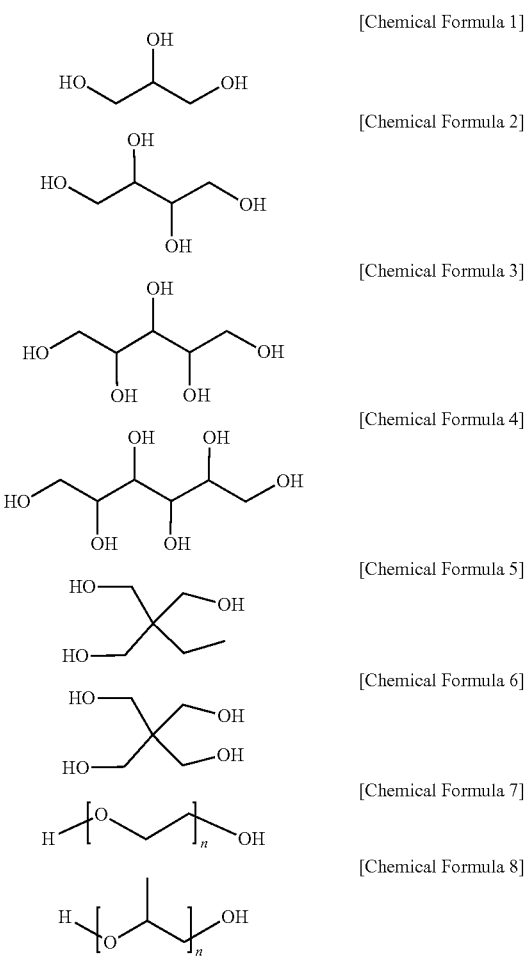

In Chemical Formulas 7 and 8 above, n may be an integer of 1 to 1,000.

Each of the compounds of Chemical Formulas 1 to 8 may include a main chain portion CP including a carbon chain or an alkyl ether group, and at least one hydroxyl group (—OH) bonded to the main chain portion CP. The hydroxyl group (—OH) of the thickener 500 may form a hydrogen bond with oxygen (O) or hydrogen (H) contained in another thickener 500 or the solvent molecule 101 of the light emitting element solvent 100. In case that the light emitting element ink 1000 is stored at the room temperature, the thickener 500 may form a network structure through a hydrogen bond between molecules, and the light emitting element ink 1000 may have a high viscosity. Since the thickener 500 is a compound of one of Formulas 1 to 8, the thickener 500 itself may have a high boiling point at the room temperature. In an embodiment, the thickener 500 may have a boiling point in a range of about 200° C. to about 450° C. and may have a boiling point of about 350° C. However, the disclosure is not limited thereto. The light emitting element ink 1000 according to an embodiment may include the light emitting elements 30 and the thickener 500 having a relatively high specific gravity to prevent the precipitation of the light emitting elements 30 even at the room temperature.

As the structure of the thickener 500, the above Chemical Formulas 1 to 8 have been discussed, but the disclosure is not limited thereto. In some embodiments, in case that the thickener 500 is a polyol-based compound including at least one hydroxyl group (—OH), the main chain portion CP of the thickener 500 may further be substituted with other substituents. For example, the main chain portion CP of the thickener 500 may further be substituted with functional groups including a halogen group, an ethoxy group, a thiol group, or a sulfanyl ethanol group.

Further, according to an embodiment, in order for the light emitting element solvent 100 of the light emitting element ink 1000 to have a high viscosity at the room temperature through a hydrogen bond with the thickener 500, the light emitting element solvent 100 may also include a functional group capable of forming a hydrogen bond. For example, similarly to the thickener 500, the solvent molecule 101 of the light emitting element solvent 100 may include at least one hydroxyl group (—OH) or may include an element such as oxygen (O), nitrogen (N), or fluorine (F) that may form a hydrogen bond with hydrogen (H) of the hydroxyl group (—OH) included in the thickener 500. However, the light emitting element solvent 100 may have a structure to have a viscosity sufficient to disperse the light emitting elements 30.

In an embodiment, the solvent molecule 101 of the light emitting element solvent 100 of the light emitting element ink 1000 may have a structure of Chemical Structural Formula 2 below as a structure including a benzene ring.

[Chemical Structure Formula 2]

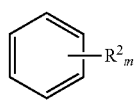

In Chemical Structural Formula 2 above, $R^2$ may include at least one of substituted or unsubstituted alcohol group, ether group, and ester group, each having 2 to 10 carbon atoms, and m may be an integer of 1 or 2. The solvent molecule 101 of the light emitting element solvent 100 may have a structure in which a benzene ring is substituted with at least one functional group of an alcohol group, an ether group, and an ester group as a functional group capable of forming a hydrogen bond with the hydroxyl group (—OH) of the thickener 500. For example, the solvent molecule 101 of the light emitting element solvent 100 may be a compound represented by one of Chemical Formulas 9 to 25 below.

[Chemical Formula 9]

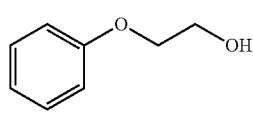

[Chemical Formula 10]

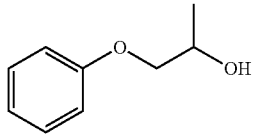

[Chemical Formula 11]

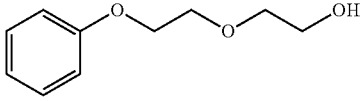

[Chemical Formula 12]

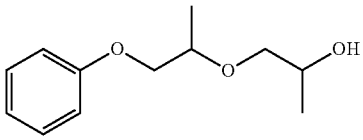

[Chemical Formula 13]

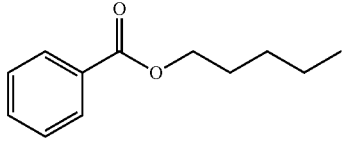

[Chemical Formula 14]

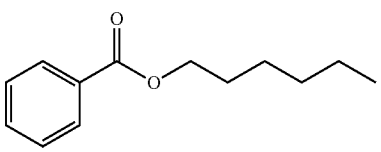

[Chemical Formula 15]

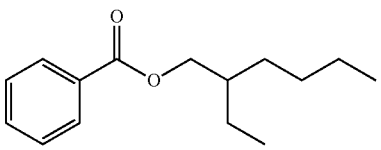

[Chemical Formula 16]

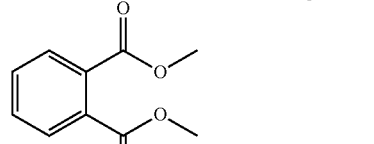

[Chemical Formula 17]

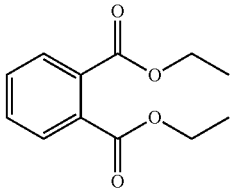

[Chemical Formula 18]

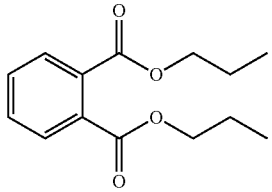

-continued

[Chemical Formula 19]

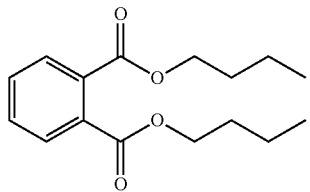

[Chemical Formula 20]

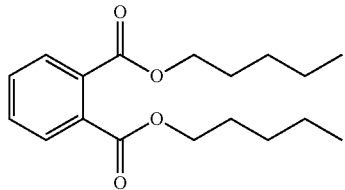

[Chemical Formula 21]

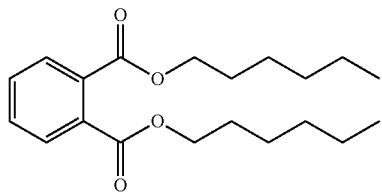

[Chemical Formula 22]

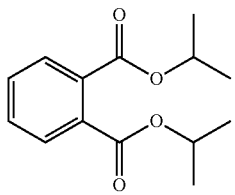

[Chemical Formula 23]

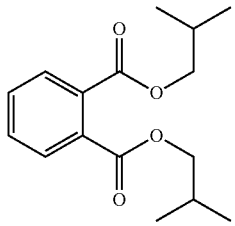

[Chemical Formula 24]

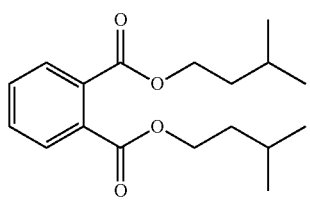

[Chemical Formula 25]

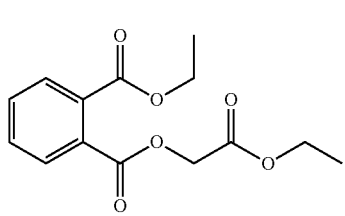

Among Chemical Formulas 9 to 25 above, in Chemical Formulas 9 to 12, each of the solvent molecules 101 of the light emitting element solvent 100 may include at least one hydroxyl group (—OH) to form a hydrogen bond with the thickener 500. In contrast, in Chemical Formulas 13 to 25, each of the solvent molecules 101 of the light emitting element solvent 100 may include a carbonyl group or an ester group as a functional group capable of forming a hydrogen bond, and thus hydrogen (H) of the thickener 500 and oxygen (O) of the solvent molecule 101 may form a hydrogen bond with each other. As the solvent molecule 101 of the light emitting element solvent 100 includes a benzene ring, reactivity with the light emitting elements 30 may be low, and a degree of dispersion thereof may be further increased according to the surface treatment of the light emitting elements 30. In case that the light emitting element solvent 100 of the light emitting element ink 1000 includes a compound represented by one of Chemical Formulas 9 to 25, a larger number of hydrogen bonds may be formed between the thickener 500 and the solvent molecule 101, and thus the light emitting element ink 1000 may have a higher viscosity. Therefore, in case that the light emitting element ink 1000 is stored at the room temperature, the precipitation of the light emitting elements 30 may be more effectively prevented.

However, the disclosure is not limited thereto, and various solvents may be used as the light emitting element solvent 100. For example, the light emitting element solvent 100 may be one of caffein, triethanol amine, glycerol, L-tyrosine, adrenalin, L-dopa, serotonin, dibenzlysebacate, ditridecyl phthalate, diethanol amine, benzyl butyl phthalate, nonyl phenol, paracetamol, triphenyl phosphate, 1,3-butanediol, 1,4-butanediol, 1-hexadecanol, oleyl alcohol, N-(2-hydroxyethyl)-2-pyrrolidone, tri-n-butyl citrate, di-(2-ethyl hexyl) sebacate, diethylene glycol, thymine, 1,9-nonanediol, benzoin, dipropylene glycol, sebacic acid, thiodiethylenglycol, 5,6-dihydroxyindole, di-(2-ethylhexyl)azelate, dihexyl phthalate, N-cyclohexyl-2-pyrrolidone, oleic acid, norephedrin, 1-naphthol, 2,4,6-trinitrophenol, N-benzyl pyrrolidone, hexane-1,6-diol, epsilon-caprolactam, tridecyl alcohol, acridine, and propylene glycol methyl ether acetate, in addition to the aforementioned examples. In case that the light emitting element solvent 100 includes the above-described compound, it may have a high boiling point, similarly to the thickener 500. In an embodiment, the light emitting element solvent 100 may have a boiling point in a range of about 200° C. to about 350° C. However, the disclosure is not limited thereto.

In some embodiments, in the light emitting element ink 1000, the thickener 500 may be glycerol having the structure of Chemical Formula 1, and the light emitting element solvent 100 may be a glycol ether-based compound. In case that the thickener 500 and the light emitting element solvent 100 of the light emitting element ink 1000 are a combination of the above-described compounds, the light emitting element ink 1000 may have a viscosity and a boiling point within the above-described ranges, and thus the light emitting element ink 1000 may have physical properties that readily discharge the light emitting elements 30. However, the disclosure is not limited thereto, and the kinds of the thickener 500 and the light emitting element solvent 100 of the light emitting element ink 1000 may be variously changed within the range in which the light emitting element ink 1000 may have the viscosity and boiling point of the above-described ranges. Further, physical properties such as the viscosity and boiling point of the light emitting element ink 1000 may be variously changed according to a mixing ratio of the thickener 500 and the light emitting element solvent 100.

In order for the light emitting element ink 1000 to be discharged through a nozzle, it should have a low viscosity. In the light emitting element ink 1000, in case that the solvent molecule 101 and the thickener 500 receive energy at a predetermined temperature higher than the room temperature, molecular motion becomes active. For example, hydrogen bonds may be broken at a temperature at which an energy stronger than that of hydrogen bonds between the thickener 500 and the solvent molecule 101 or between the thickeners 500 may be transferred. In the light emitting element ink 1000 placed at a predetermined temperature or higher, the thickeners 500 may not form a network structure with the solvent molecules 101 of the light emitting element solvent 100 or other thickeners 500, and thus the light emitting element ink 1000 may have a low viscosity.

Figure 9:
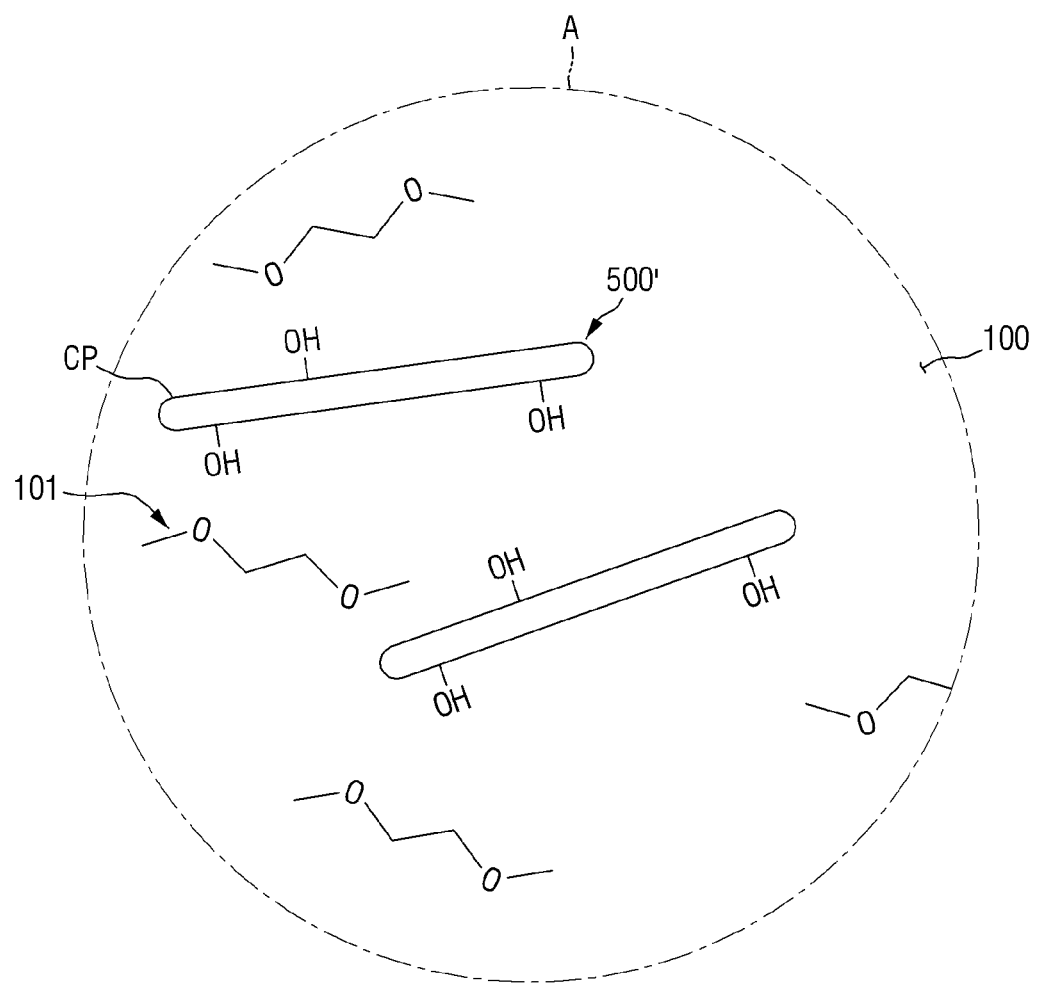
FIG. 9 is a schematic diagram illustrating an intermolecular bond between a thickener and a light emitting element solvent in the light emitting element ink of FIG. 7 at another temperature.

FIG. 9 is a schematic diagram illustrating an intermolecular bond between a thickener and a light emitting element solvent of the light emitting element ink of FIG. 7 at another temperature. FIG. 9 is an enlarged view of area A of FIG. 7 and illustrates the form of a molecule of a thickener 500' dispersed in the light emitting element solvent 100 at a predetermined temperature of room temperature or higher.

Referring to FIG. 9, in the printing process of the light emitting element ink 1000, the light emitting element solvent 100 should have a viscosity of a predetermined value or less in order for the light emitting element ink 1000 to flow in an inkjet head of an inkjet printing apparatus or be discharged through a nozzle of an inkjet printing apparatus.

In the specification, the term "printing" of the light emitting elements 30 may mean that the light emitting elements 30 are discharged or ejected to a predetermined object by using an inkjet printing apparatus. For example, the term "printing" of the light emitting elements 30 may mean that the light emitting elements 30 are discharged directly through a nozzle of the inkjet printing apparatus or are discharged in a stated in which the light emitting elements 30 are dispersed in the light emitting element ink 1000. However, the disclosure is not limited thereto, and the term "printing" of the light emitting elements 30 may mean that the light emitting elements 30 or the light emitting element ink 1000 in which the light emitting elements 30 are dispersed are ejected onto a target substrate SUB (see FIG. 11) to allow the light emitting elements 30 or the light emitting element ink 1000 to be mounted on the target substrate SUB.

In case that the light emitting element ink 1000 is discharged through the nozzle of the inkjet printing apparatus, the thickener 500' may not form a network structure when the temperature of the nozzle is adjusted such that the light emitting element ink 1000 is placed at the room temperature or higher. At the room temperature or higher, hydrogen bonds HB1 and HB2 between molecules of the thickener 500' of the light emitting element ink 1000 may be broken as molecular motion becomes active, and the thickeners 500' and the solvent molecules 101 of the light emitting element solvent 100 may be individually dispersed without forming a network structure.

According to an embodiment, the light emitting element ink 1000 may have a viscosity in a range of about 5 cP to about 15 cP, about 7 cP to about 13 cP, or a viscosity of about 10 cP, measured at a temperature in a range of about 40° C. to about 60° C. In case that the light emitting element ink 1000 has a viscosity within the above ranges, the light emitting element ink 1000 may be readily discharged through the nozzle, and the dispersion degree of the light emitting elements 30 may be maintained because a printing process is performed previously even if the light emitting elements 30 are gradually precipitated. For example, the number of light emitting elements 30 per unit droplet of the light emitting element ink 1000 discharged from the nozzle of the inkjet printing apparatus may be maintained uniformly. However, the viscosity of the light emitting element ink 1000 is not limited thereto, and the temperature inside the nozzle of an ink jet head and the viscosity of the light emitting element ink 1000 may be variously changed within a range in which the light emitting element ink 1000 may be discharged from the nozzle of the ink jet head.

The light emitting element ink 1000 may include a predetermined amount of light emitting elements 30 per unit weight, and the thickener 500 may be included in a predetermined content with respect to the weight of the light emitting elements 30. According to an embodiment, the light emitting element ink 1000 may include about 5 to 50 parts by weight of the thickener 500 with respect to 100 parts by weight of the light emitting element ink 1000. In case that the thickener 500 is included in an amount of less than about 5 parts by weight with respect to 100 parts by weight of the light emitting element ink 1000, an effect of preventing the precipitation of the light emitting elements 30 in the storage state may be insufficient, and in case that the thickener 500 is included in an amount of about 50 parts by weight or more, the viscosity of the light emitting element ink 1000 may be too high, and thus the nozzle inlet may be blocked during the printing process. In case that the light emitting element ink 1000 includes the thickener 500' within the above ranges, the light emitting element ink 1000 may be smoothly discharged through the nozzle while preventing the precipitation of the light emitting elements 30.

The content of the light emitting elements 30 included in the light emitting element ink 1000 may be changed depending on the number of the light emitting elements 30 per unit droplet of the light emitting element ink 1000 discharged through the nozzle during the printing process. In an embodiment, the light emitting elements 30 may be included in an amount of about 0.01 to about 1 part by weight with respect to 100 parts by weight of the light emitting element ink 1000. However, this is an example, and the content of the light emitting elements 30 may vary depending on the number of light emitting elements 30 per unit droplet of the light emitting element ink 1000.

The light emitting element ink 1000 may further include a dispersant (not shown) that improves the dispersion degree of the light emitting elements 30. The kind of the dispersant is not particularly limited, and the dispersant may be added in an appropriate amount to further disperse the light emitting elements 30. For example, the dispersant may be included in an amount of about 10 to about 100 parts by weight with respect to 100 parts by weight of the light emitting elements 30. However, the content of the dispersant is not limited thereto.

According to an embodiment, the light emitting element ink 1000 may include the thickener 500, and thus the viscosity of the light emitting element ink 1000 may vary during the process of manufacturing the display device 10. The light emitting element ink 1000 may have a suitable viscosity for each storage step of the light emitting element ink 1000 and each printing step through a nozzle. In particular, in the storage step of the light emitting element ink 1000, as the light emitting element ink 1000 has a high viscosity, the precipitation of the light emitting elements 30 may be prevented, and in the printing step through a nozzle, as the light emitting element ink 1000 has a low viscosity, the printing process of the light emitting elements 30 may be performed smoothly.

When a product including the light emitting elements 30 using the light emitting element ink 1000 is manufactured according to an embodiment, a uniform number of light emitting elements 30 may be disposed in each unit area, and the light emitting element solvent 100 and the thickener 500, remaining as foreign matter, in a subsequent process may be completely removed. Accordingly, reliability of the product including the light emitting elements 30 may be improved. According to an embodiment, the display device 10 described above with reference to FIGS. 1 to 3 may be manufactured using the light emitting element ink 1000.

In the process of manufacturing the display device 10, a process of placing the light emitting elements 30 on the electrodes 21 and 22 may be performed, and this process may be formed by a printing process using the light emitting element ink 1000.

Hereinafter, a process of manufacturing the display device 10 according to an embodiment will be described with reference to other drawings.

Figure 10:
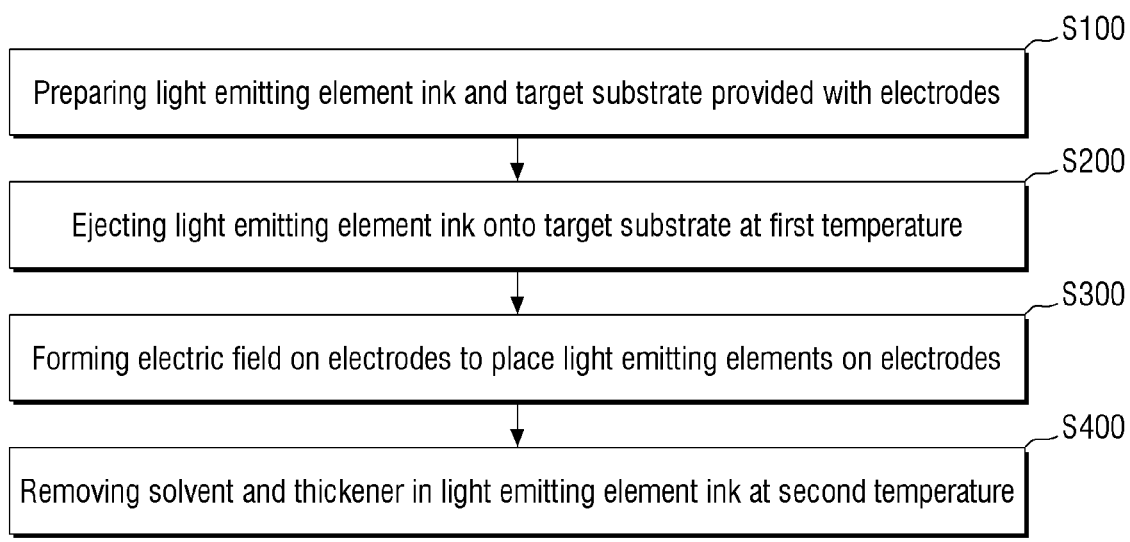
FIG. 10 is a schematic flowchart illustrating a method of manufacturing a display device according to an embodiment.

FIG. 10 is a flowchart illustrating a method of manufacturing a display device according to an embodiment.

Referring to FIG. 10, a method of manufacturing a display device 10 according to an embodiment may include the steps of preparing a light emitting element ink 1000 and a target substrate SUB on which electrodes 21 and 22 are formed (S100); ejecting the light emitting element ink 1000 onto the target substrate SUB at a first temperature (S200); forming an electric field on the electrodes 21 and 22 to place the light emitting elements 30 on the electrodes 21 and 22 (S300); and removing a light emitting element solvent 100 and a thickener 500 of the light emitting element ink 1000 at a second temperature (S400).

The light-emitting device ink 1000 may have a high viscosity at room temperature and may be stored such that the light emitting elements 30 do not precipitate. The process of manufacturing the display device 10 may include a step of printing the light emitting element ink 1000 including the light emitting elements 30 on the target substrate SUB at a first temperature higher than room temperature; and a step of removing the light emitting element solvent 100 and the thickener 500 of the light emitting element ink 1000 at a second temperature different from the first temperature. In the light emitting element ink 1000, the viscosity thereof may be changed depending on the temperature during the storage step and the printing step, and the light emitting element ink 1000 may be readily printed on the target substrate SUB while the precipitation of the light emitting elements is prevented. Hereinafter, the method of manufacturing the display device 10 will be described in detail with reference to other drawings.

Figure 11:
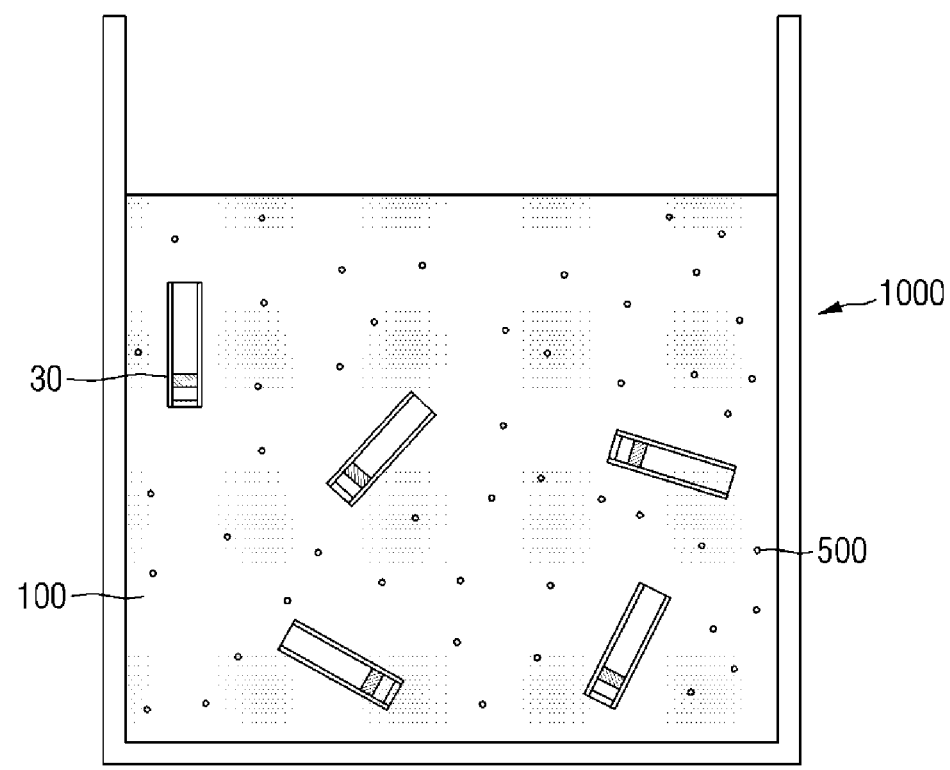
FIGS. 11 to 13 are schematic cross-sectional views illustrating steps in a process of manufacturing a display device according to an embodiment.
Figure 11:
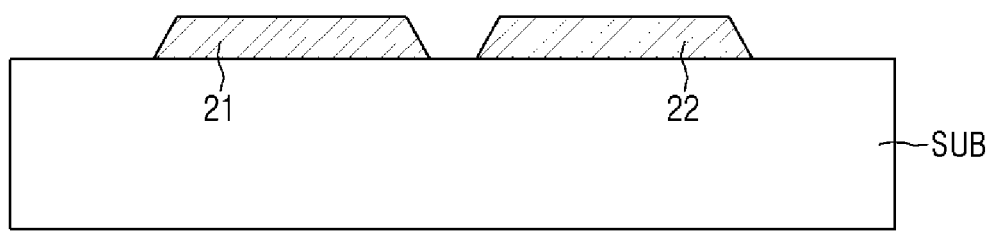
Figure 12:
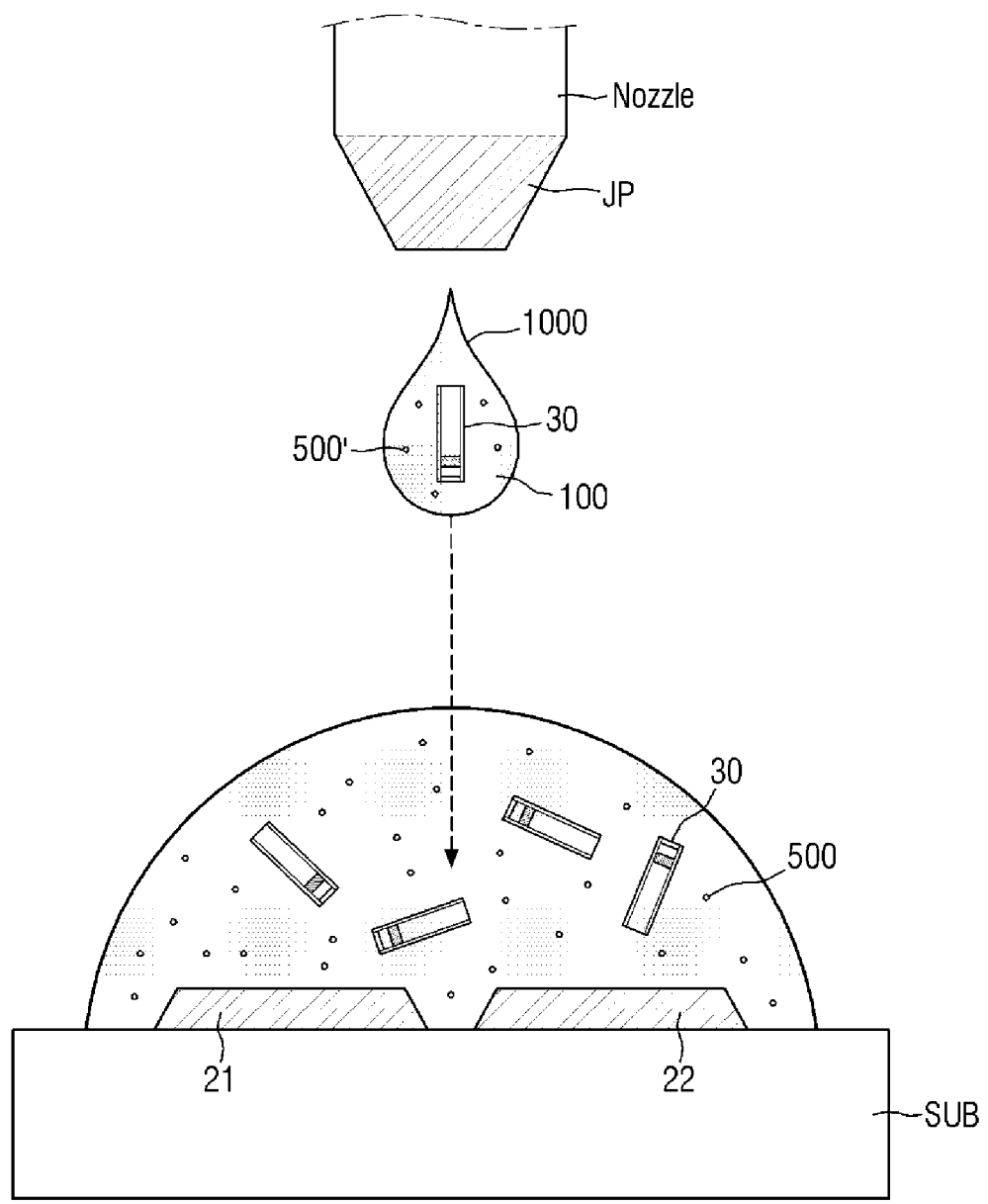
Figure 13:
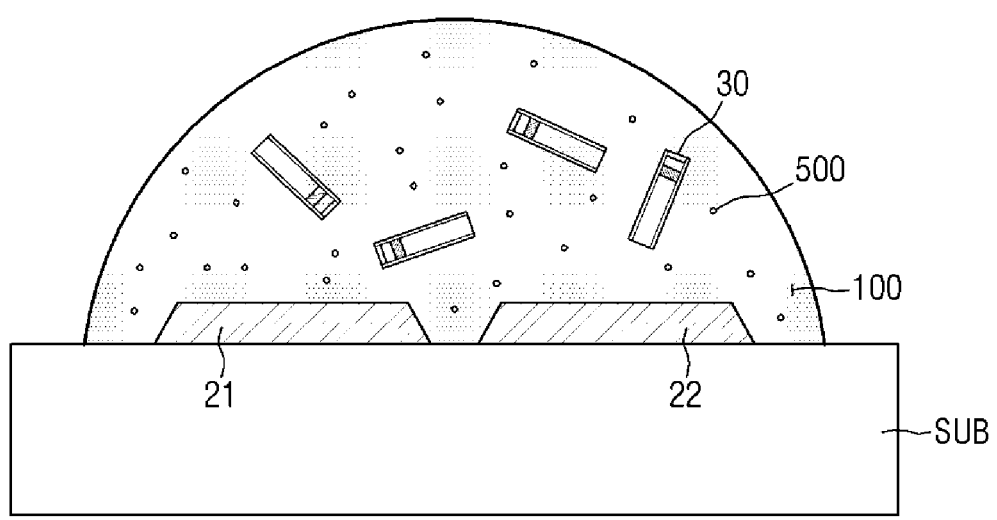

FIGS. 11 to 13 are schematic cross-sectional views illustrating steps of a process of manufacturing a display device according to an embodiment.

First, referring to FIG. 11, a light emitting element ink 1000 including light emitting elements 30, a light emitting element solvent 100, and a thickener 500, and a target substrate SUB provided with a first electrode 21 and a second electrode 22 are prepared. Although it is shown in the drawing that a pair of electrodes is disposed on the target substrate SUB, a larger number of electrode pairs may be disposed on the target substrate SUB. The target substrate SUB may include circuit elements disposed on the first substrate 11 of the display device 10 in addition to the first substrate 11. Hereinafter, for convenience of description, these circuit elements will be omitted.

The light emitting element ink 1000 may include a solvent 100, light emitting elements 30 dispersed in the solvent, and a photodegradable thickener 500. In some embodiments, the light emitting element ink 1000 may be stored at room temperature or at a temperature of about 25° C., and the thickener 500 may form hydrogen bonds between molecules to form a three-dimensional network structure in the solvent 100. The light emitting element ink 1000 may have a high viscosity, for example, in a range of about 20 cp to about 300 cp even at room temperature and the light emitting elements 30 may be maintained in a dispersed state for a long time.

The step of preparing the light emitting element ink 1000 may be performed by a first dispersion process of mixing the light emitting elements 30, the light emitting element solvent 100, and a dispersant to prepare a solution, and by a second dispersion process of adding the thickener 500 to the solution prepared in the first dispersion process. For example, the first dispersion process may be performed by mixing the light emitting elements 30 and the dispersant with the light emitting element solvent 100 and then stirring the solution for 5 minutes or more. As described above, the light emitting element 30 may have a diameter of about 1 μm or less, or about 500 nm or less, and a length of about 1 μm to 10 μm or about 4 μm or greater. The light emitting elements 30 may be included in an amount of about 0.01 to about 1 part by weight with respect to 100 parts by weight of the light emitting element ink 100, and the dispersant may be included in an amount of 10 to 100 parts by weight with respect to 100 parts by weight of the light emitting elements 30. The mixing process may be performed by a sonication process, a stirring process, a milling process, or the like.

Subsequently, a second dispersion process in which a thickener 500 is further added to and mixed with the solution prepared in the first dispersion process is performed. The thickener 500 may be included in an amount of about 5 to about 50 parts by weight with respect to 100 parts by weight of the light emitting element ink 1000. The mixing process may be performed by sequentially performing a sonication process and a stirring process each for 5 minutes or longer. In order for the thickener 500 to be mixed easily, the mixing process may be performed at a temperature higher than the room temperature (25° C.), for example, at about 40° C. or higher.

The light emitting element ink 1000 prepared by the first and second dispersion processes may be stored at room temperature (25° C.). The thickener 500 of the light emitting element ink 1000 may form an intermolecular hydrogen bond with the light emitting element solvent 100 and another thickener 500, and the light emitting element ink 1000 may have a viscosity of at least about 20 cP or more. The light emitting elements 30 may be maintained in a dispersed state with little precipitation.

Subsequently, referring to FIGS. 12 and 13, the light emitting element ink 1000 may be sprayed onto the first electrode 21 and the second electrode 22 on the target substrate SUB. In an embodiment, the light emitting element ink 1000 may be sprayed onto the electrodes 21 and 22 by a printing process using an inkjet printing apparatus. The light emitting element ink 1000 may be ejected through a nozzle of an inkjet head included in an inkjet printing apparatus. The light emitting element ink 1000 discharged from the nozzle may be attached onto the electrodes 21 and 22 disposed on the target substrate SUB. The light emitting element 30 may have a shape extending in a direction and may be dispersed in the light emitting element ink 1000 in a state in which the extending direction has a random alignment direction.

In some embodiments, before the light emitting element ink 1000 is ejected through a nozzle, a third dispersion process of redispersing the light emitting elements 30 and the thickener 500 may be performed. For example, the stored light emitting element ink 1000 may be subjected to a sonication process and a vortexing or stirring process each for 5 minutes or longer. Even if the light emitting element ink 1000 has a high viscosity and thus the light emitting elements 30 hardly precipitates, the third dispersion process of sufficiently dispersing the light emitting elements 30 may be performed before the printing process through the nozzle. Accordingly, the light emitting elements 30 of the light emitting element ink 1000 prepared in the inkjet printing apparatus may have a level of dispersion degree similar to that of the initial storage state.

According to an embodiment, in the printing process of the light emitting element ink 1000, a discharge portion JP of the nozzle may be adjusted to a first temperature higher than the room temperature, and the light emitting element ink 1000 may have a relatively low viscosity at the first temperature and may be discharged onto the target substrate SUB through the discharge portion JP. In some embodiments, the first temperature may be in a range of about 40° C. to about 60° C., and at the first temperature, the light emitting element ink 1000 may have a viscosity in the range of about 5 cp to about 15 cp, or a viscosity of about 10 cp. During the printing process of the light-emitting element ink 1000, in case that the temperature of the discharge portion JP of the nozzle is controlled to the first temperature of the room temperature or higher, the light emitting element ink 1000 may have a low viscosity and may be readily discharged from the nozzle to prevent nozzle clogging due to the viscosity of the solution.

Figure 14:
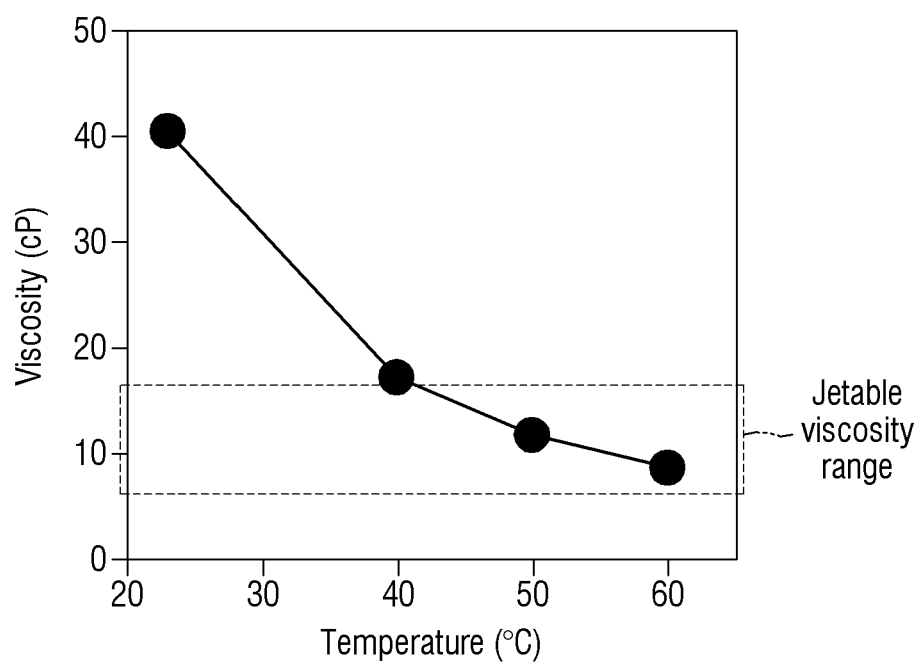
FIG. 14 is a graph illustrating a change in viscosity of the light emitting element ink according to temperature.

FIG. 14 is a schematic graph illustrating a change in viscosity of the light emitting element ink according to the temperature. FIG. 14 illustrates a viscosity change (cP) of the light emitting element ink including the thickener 500 according to the temperature (° C.).

Referring to FIG. 14, the light emitting element ink 1000 may have a high viscosity at the room temperature. At a temperature of about 25° C., the light emitting element ink 1000 may have a viscosity of 20 cP or more and 200 cP or less, for example, about 100 cP as the thickener 500 forms a three-dimensional network structure. In the storage state of the light emitting element ink 1000, the light emitting elements 30 hardly precipitate and may maintain an initial dispersion state.

In contrast, the light emitting element ink 1000 may have a low viscosity at a temperature of room temperature or higher. In a temperature range of about 40° C. to about 60° C., the light emitting element ink 1000 may have a viscosity between about 5 cps and about 17 cps. A solution having a viscosity within the above range ("Jetable viscosity range" of FIG. 14) may be readily discharged through a nozzle, and the nozzle may not be clogged by the viscosity of the solution.

In case that the light emitting element ink 1000 has a low viscosity regardless of temperature or even at the room temperature, the light emitting elements 30 included in the light emitting element ink 1000 may not maintain an initial dispersion state over time and may be precipitated. When a printing process is performed by using the light emitting element ink 1000 in which the light emitting elements 30 are dispersed, the light emitting elements 30 may be precipitated, so that the number of light emitting elements 30 included per unit droplet of the solution may be less than the calculated value or may not be uniform per unit droplet. When a process of re-dispersing the precipitated light emitting elements 30 is performed, the process of manufacturing the display device 10 may become complicated, and in some case, it may not be easy to re-disperse the light emitting elements 30 at a desired dispersion degree. When a printing process is performed by using the light emitting element ink 1000 according to an embodiment, the light emitting elements 30 are dispersed and are hardly precipitated, the number of light emitting elements 30 included per unit droplet may be uniform per unit droplet. In the method of manufacturing the display device 10, the display device 10 is manufactured by using the light emitting element ink 1000, and the manufactured display device 10 may have a uniform number of light emitting elements 30 disposed per unit area, so that the product reliability may be improved. Simultaneously, during the printing process through a nozzle, the temperature is controlled such that the light emitting element ink 1000 may have a low viscosity, and thus the discharge portion JP of the nozzle may be prevented from being clogged during the printing process.

Subsequently, an electric field may be formed in the light emitting element ink 1000 to place the light emitting elements on the electrodes 21 and 22, and the light emitting element solvent 100 and the thickener 500 may be removed (S400).

Figure 15:
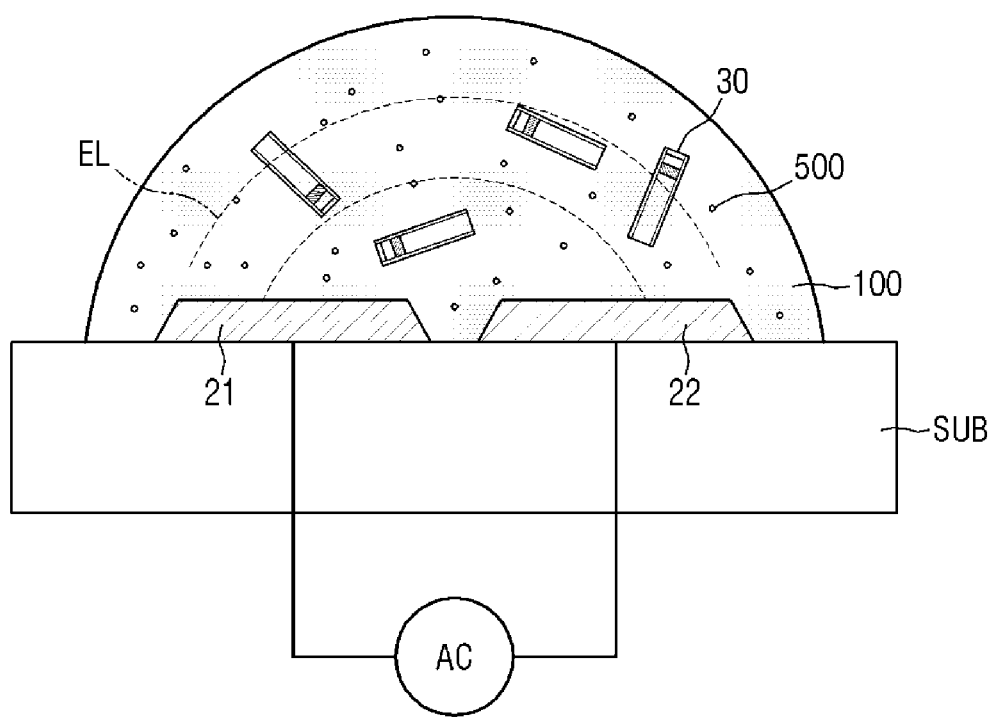
FIGS. 15 to 17 are schematic cross-sectional views illustrating other steps in a process of manufacturing a display device according to an embodiment.
Figure 16:
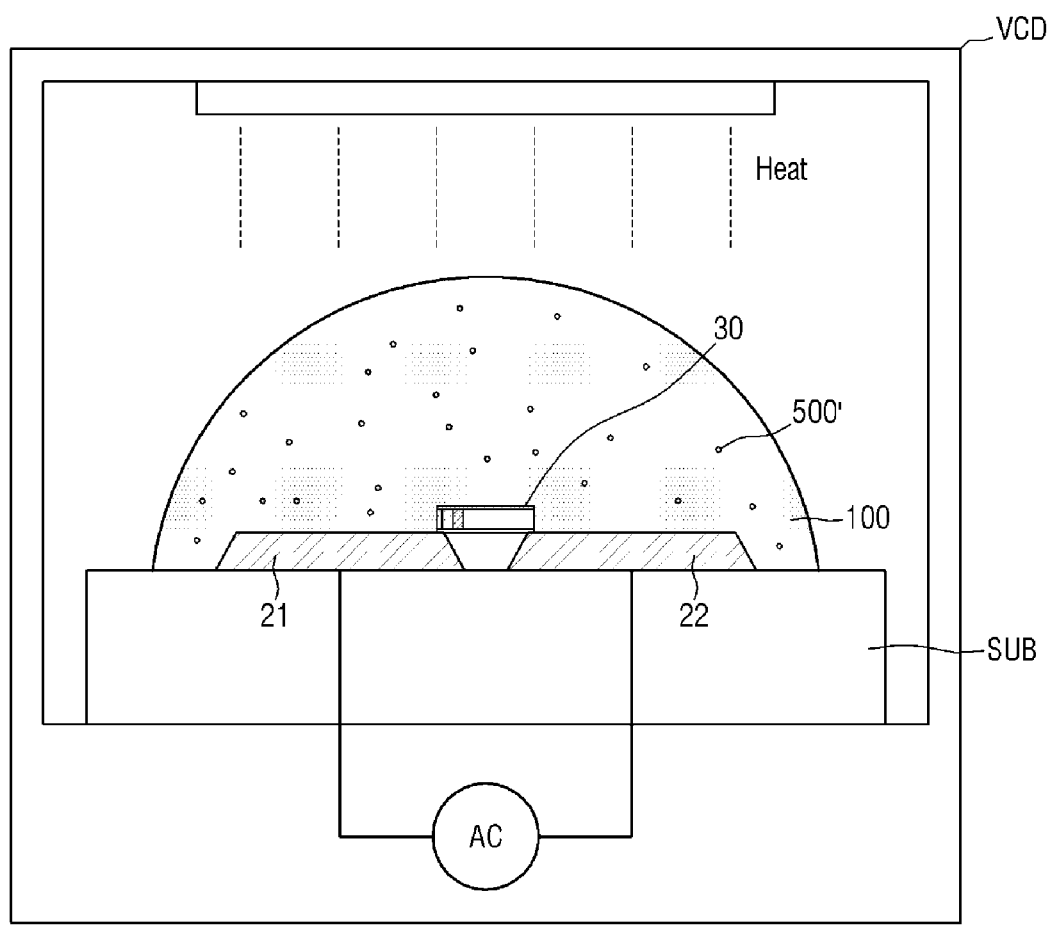
Figure 17:
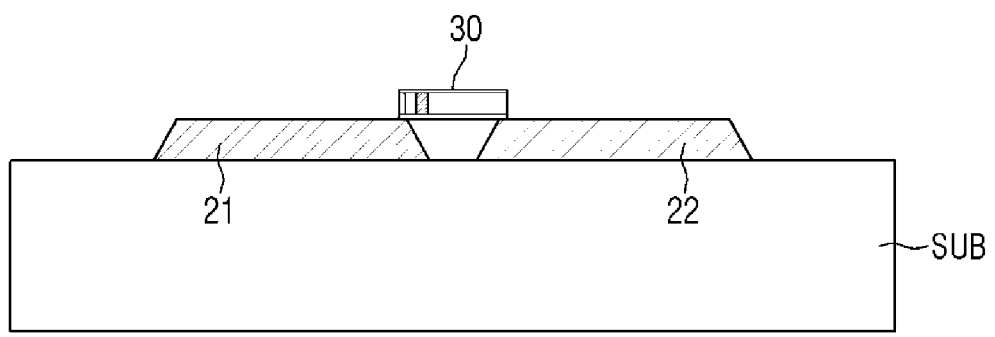

FIGS. 15 to 17 are schematic cross-sectional views illustrating other steps in a process of manufacturing a display device according to an embodiment.

First, referring to FIG. 15, when the light emitting element ink 1000 including the light emitting elements 30 is ejected on the target substrate SUB, an alignment signal may be applied to the electrodes 21 and 22 to generate an electric field EL on the target substrate SUB. The light emitting elements 30 dispersed in the light emitting element solvent 100 may be subjected to a dielectrophoretic force by the electric field EL and may be arranged on the electrodes 21 and 22 while the alignment direction and position of the light emitting elements 30 are changed.

When the electric field EL is generated on the target substrate SUB, the light emitting elements 30 may be subjected to a dielectrophoretic force. In case that the electric field EL generated on the target substrate SUB is generated parallel to the upper surface of the target substrate SUB, the extending direction of the light emitting element is aligned to be parallel to the target substrate SUB, so that the light emitting elements 30 may be arranged on the first electrode 21 and the second electrode 22. The light emitting elements 30 may move toward the electrodes 21 and 22 from the initially dispersed position by the dielectrophoretic force. Both ends of the light emitting element 30 may be disposed on the first electrode 21 and the second electrode 22 while the position and alignment direction thereof are changed by the electric field EL. The light emitting element 30 may include semiconductor layers doped with a dopant(s) of different conductivity types and may have a dipole moment therein. In case that the light emitting element 30 having a dipole moment is placed in the electric field EL, the light emitting element 30 may be subjected to the dielectrophoretic force such that both ends thereof are disposed on the electrodes 21 and 22, respectively.

The term "degree of alignment" of the light emitting elements 30 may refer to a deviation in the alignment direction and mounted position of the light emitting elements 30 aligned on the target substrate SUB. For example, in case that the deviation in the alignment direction and mounted position of the light emitting elements 30 is great, it may be understood that the alignment degree of the light emitting elements 30 is low, and in case that the deviation in the alignment direction and mounted position of the light emitting elements 30 is small, it may be understood that the alignment degree of the light emitting elements 30 is high or is improved.

However, during the process of manufacturing the display device 10, after the light emitting element 30 is disposed between the electrodes 21 and 22, a process of removing the solvent 100 and the thickener 500 by applying heat or light to the light emitting element ink 1000 may be performed. The light emitting element ink 1000 may have a high viscosity because of an intermolecular hydrogen bond of the thickener 500 according to the temperature. Accordingly, the solvent 100 and the thickener 500 may not be removed easily and may remain as a foreign matter on the electrodes 21 and 22 or the light emitting elements 30. Further, as the light emitting element ink 1000 has a high viscosity, the intensity of the dielectrophoretic force on the light emitting elements 30 by the electric field formed on the electrodes 21 and 22 may not be sufficient. Moreover, a high-temperature heat treatment may be required to remove the solvent 100 and the thickener 500 each having a high viscosity, and the initial alignment state of the light emitting elements 30 may be changed by an attraction force due to the flow of fluid or an attraction force between the thickener 500 and the light emitting elements 30 while the solvent 100 and the thickener 500 are removed.

In the method of manufacturing the display device 10 according to an embodiment, the solvent 100 and the thickener 500 may be removed at the second temperature and may be completely removed by a heat treatment process under a low-pressure for an easier removing process.

Referring to FIGS. 16 and 17, the process of removing the light emitting element solvent 100 and the thickener 500 may be performed in a chamber VCD capable of adjusting internal pressure. In the chamber VCD, the internal pressure in the device may be adjusted, and the target substrate SUB may be heated in a state in which the internal pressure is adjusted, so as to remove the light emitting element solvent 100 and the thickener 500. In the state in which the light emitting elements 30 are disposed on the electrodes 21 and 22 by the electric field EL, the thickener 500 may form an intermolecular hydrogen bond according to the temperature. The solvent 100 and the thickener 500 may be removed while the viscosity of the light emitting element ink 1000 is reduced by a heat treatment at the second temperature. However, an energy for removing a hydrogen bond between molecules of the light emitting element solvent 100 and the thickener 500 may be further required in addition to energy for volatilizing their respective molecules. In this case, the heat treatment process should be performed at a temperature above the boiling point of each molecule, and a high-temperature heat treatment process may damage the circuit layers of the display device 10.

In the method of manufacturing the display device 10, the light emitting element solvent 100 and the thickener 500' may be heat-treated under an environment of a low-pressure to completely remove them even at a temperature below the boiling point of the thickener 500'. According to an embodiment, the process of removing the light emitting element solvent 100 and the thickener 500' may be performed at a pressure of about $10^{-4}$ Torr to about 1 Torr and a temperature of about 25° C. to about 150° C. In cases where a heat treatment process is performed within the above pressure range, the boiling point of the thickener 500' and the light emitting element solvent 100 may be lowered, and a hydrogen bond therebetween may be more readily removed. For example, where the thickener 500' is a polyol-based compound, its boiling point may be between about 200° C. and about 450° C. However, the thickener 500' and the light emitting element solvent 100 may be readily removed even at a temperature range of about 150° C. or lower under a low-pressure environment as described above in the chamber VCD. The heat treatment process in the chamber VCD may be performed for about 1 minute to about 30 minutes. However, it is not limited thereto.

As the process of removing the light emitting element solvent 100 and the thickener 500' is performed by a heat treatment process under a low-pressure environment, the light emitting element solvent 100 and the thickener 500' that may remain as a foreign matter in a subsequent process may be completely removed. Further, in the process of removing the light emitting element solvent 100 and the thickener 500', a change in the initial alignment state of the light emitting elements 30 due to an attraction force by the flow of fluid or an attraction force between the thickener 500' and the light emitting elements 30 may be prevented. For example, in the display device 10, the alignment degree of the light emitting elements 30 may be improved.

Subsequently, insulating layers and a contact electrode may be formed on the light emitting element 30 and the electrodes 21 and 22 to manufacture the display device 10. By the above processes, the display device 10 including the light emitting elements 30 may be manufactured. The display device 10 may be manufactured using the light emitting element ink 1000 including the thickener 500. In the display device 10, a uniform number of light emitting elements 30 may be arranged for each unit area with a high alignment degree, and the product reliability may be improved.

After the light emitting element ink 1000 is discharged from the discharge portion JP of the nozzle, the viscosity may vary according to the temperature of the upper portion of the target substrate SUB. In case that the light emitting element ink 1000 applied on the target substrate SUB has a high viscosity, the process of aligning the light emitting elements 30 by the electric field EL may not be easy. According to an embodiment, during the manufacturing process of the display device 10, the process of applying the light emitting elements 30 to the electrodes 21 and 22 may be performed at the first temperature similar to that of the discharge portion JP of the nozzle or at a temperature higher than the first temperature. For this purpose, in the process of generating the electric field EL on the electrodes 21 and 22, a process or apparatus for controlling the temperature of the upper portion of the target substrate SUB may be further included.

Figure 18:
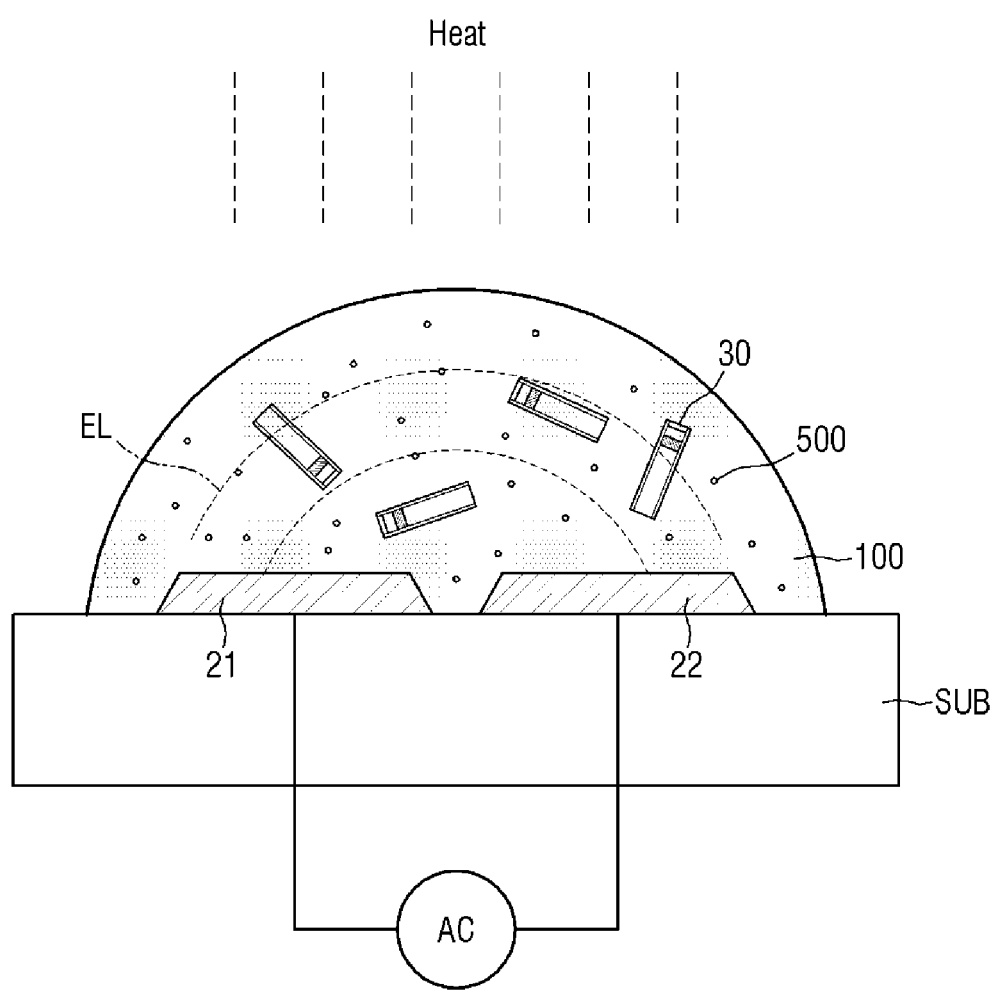
FIG. 18 is a schematic cross-sectional view illustrating a step in a process of manufacturing a display device according to another embodiment.

FIG. 18 is a schematic cross-sectional view illustrating a step in a process of manufacturing a display device according to another embodiment.

Referring to FIG. 18, in the process of manufacturing the display device 10, in the step of forming an electric field EL on the electrodes 21 and 22 and applying the light emitting elements 30 onto the electrodes 21 and 22, the electric field EL may be generated while the target substrate SUB is heat-treated ("Heat" in FIG. 18). The heat treatment on the target substrate SUB may be a process for lowering the viscosity of the light emitting element ink 1000 by adjusting the light emitting element ink 1000 applied to the electrodes 21 and 22 to the first temperature or higher. As the light emitting element ink 1000 applied on the target substrate SUB has a low viscosity, the light emitting elements 30 whose position and orientation are changed by the electric field EL may more actively move because the resistance caused by the viscosity of fluid in the light emitting element ink 1000 is low. Accordingly, the light emitting elements 30 may be arranged on the electrodes 21 and 22 with a high degree of alignment. In the drawing, only a process by a separate heat treatment device is illustrated as a method of heat-treating the target substrate SUB, but the disclosure is not limited thereto. In some embodiments, the heat treatment on the target substrate SUB may be performed by placing the target substrate SUB on a stage including a heat source or a heat sink and then controlling the temperature of the upper surface of the stage.

During the process of manufacturing the display device 10, in order to further improve the alignment degree of the light emitting elements 30, a process of irradiating light may be further performed.

Figure 19:
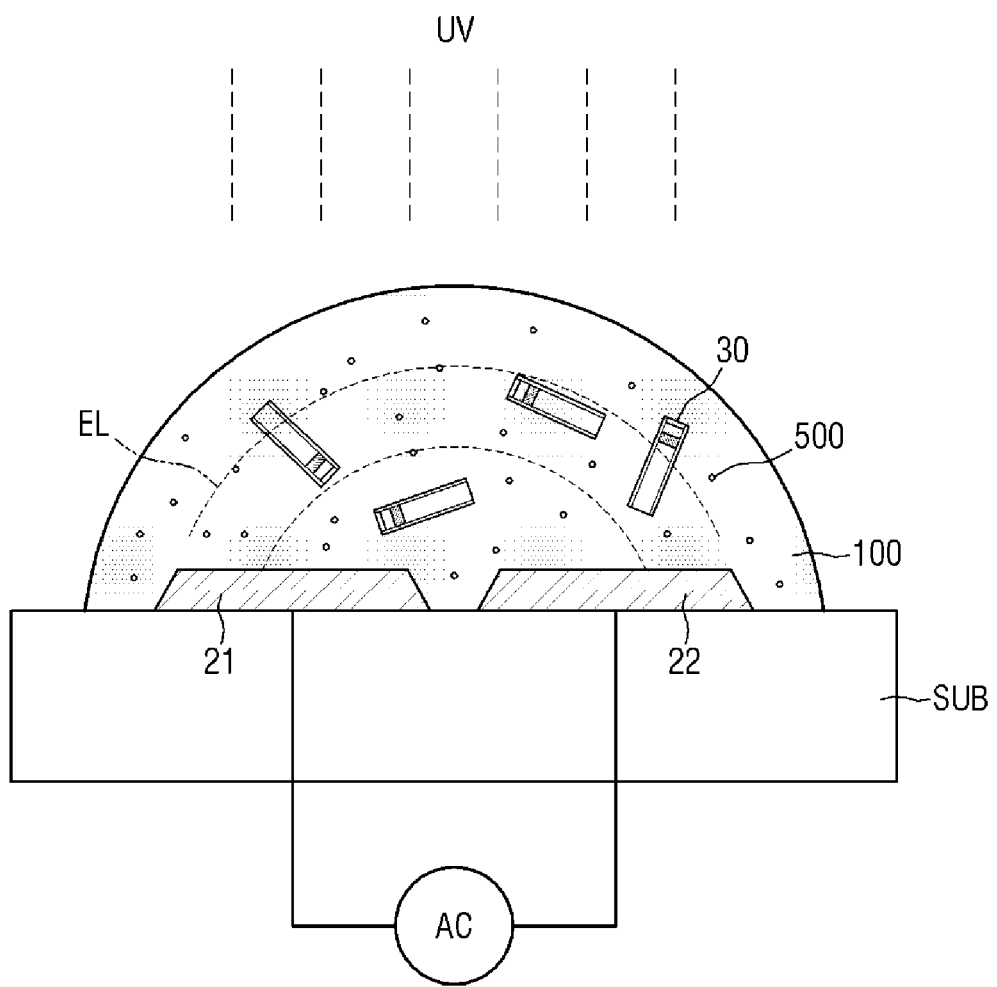
FIG. 19 is a schematic cross-sectional view illustrating a step in a process of manufacturing a display device according to another embodiment.

FIG. 19 is a schematic cross-sectional view illustrating a step in a process of manufacturing a display device according to another embodiment.

Referring to FIG. 19, in the process of manufacturing the display device 10, in the step of forming an electric field EL on the electrodes 21 and 22, ultraviolet light UV may be applied to the light emitting elements 30 ejected on the target substrate SUB. The light emitting elements 30 may have a dipole moment, and when ultraviolet light UV is applied to the light emitting elements 30, the light emitting elements 30 may react with the ultraviolet light UV to have a larger dipole moment. The light emitting elements 30 having a large dipole moment may be aligned such that an end thereof faces in a predetermined direction in response to the electric field EL formed on the electrodes 21 and 22. At the same time, at least one end of the light emitting elements 30 may be disposed on the first electrode 21 or the second electrode 22. For example, each of the light emitting elements 30 may have a first end disposed on the first electrode 21 and a second end disposed on the second electrode 22.

In the step of placing the light emitting elements 30 on the electrodes 21 and 22, when an electric field EL is formed while ultraviolet light UV is applied, the first ends of light emitting elements 30 may be aligned in a predetermined direction as the electrophoretic reactivity of the light emitting elements 30 increases. Accordingly, the light emitting elements 30 may be arranged on the electrodes 21 and 22 with a high alignment degree, and the product reliability of the display device 10 may be further improved.

The light emitting element ink according to an embodiment may include a thickener to have a different viscosity according to the temperature. In the storage state of the light emitting element ink at the room temperature, the viscosity of a solution may be high, so that precipitation of light emitting elements may be prevented. In the printing state of the light emitting element ink, the viscosity of the solution may be low, so that a nozzle may not be clogged, and thus the ink may be easily discharged.

In the method of manufacturing a display device according to an embodiment, the display device may be manufactured using the light emitting element ink, so that a printing process may be performed in a state in which light emitting elements are dispersed in the ink, a uniform number of light emitting elements in each unit area may be arranged with a high alignment degree. Further, by a heat treatment under a low-pressure environment, a light emitting element solvent and a thickener remaining as a foreign mater matter in a subsequent process may be completely removed. Therefore, a display device having increased product reliability may be manufactured.

In concluding the detailed description, those skilled in the art will appreciate that many variations and modifications can be made to the embodiments without substantially departing from the principles of disclosure. Therefore, the disclosed embodiments of the disclosure are used in a generic and descriptive sense only and not for purposes of limitation.

What is claimed is:

1. A light emitting element ink, comprising:
a light emitting element solvent;
a light emitting element dispersed in the light emitting element solvent, the light emitting element including:
a plurality of semiconductor layers; and
an insulating film surrounding outer surfaces of the plurality of semiconductor layers; and
a thickener dispersed in the light emitting element solvent, wherein
the thickener includes a compound represented by Chemical Structural Formula 1 below as a polyol-based compound capable of forming a hydrogen bond with the light emitting element solvent or another thickener, and
the thickener has a boiling point in a range of about 200° C. to about 450° C.,

[Chemical Structural Formula 1]

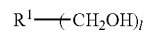

wherein, in Chemical Structural Formula 1,
$R^1$ is a linear or branched alkyl group or a linear or branched alkyl ether group having 1 to 3000 carbon atoms,
the linear or branched alkyl group and the linear or branched alkyl ether group are substituted with a hydroxyl group (—OH) or is unsubstituted, and
$l$ is an integer of 1 to 10.

2. The light emitting element ink of claim 1, wherein the thickener includes a compound represented by one of Chemical Formulas 1 to 8 below:

[Chemical Formula 1]
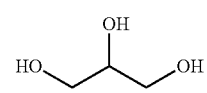

[Chemical Formula 2]
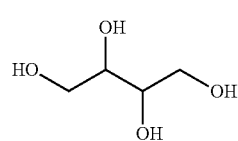

[Chemical Formula 3]
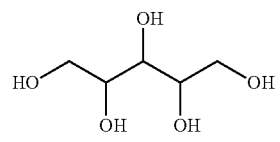

[Chemical Formula 4]
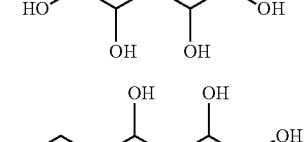

[Chemical Formula 5]
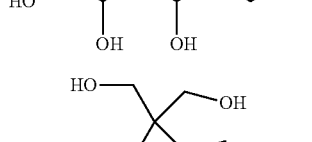

[Chemical Formula 6]

[Chemical Formula 7]
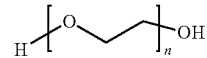

-continued

[Chemical Formula 8]
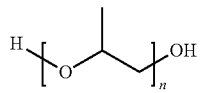

wherein, in Chemical Formulas 7 and 8, n is an integer of 1 to 1000.

3. The light emitting element ink of claim 2, wherein the thickener forms an intermolecular hydrogen bond with the light emitting element solvent at a temperature of about 25° C. and the thickener to form a network structure.

4. The light emitting element ink of claim 3, wherein the light emitting element ink has a viscosity in a range of about 20 cP to about 300 cP at a temperature of about 25° C.

5. The light emitting element ink of claim 2, wherein the light emitting element ink has a viscosity in a range of about 5 cP to about 15 cP at a temperature in a range of about 40° C. to about 60° C.

6. The light emitting element ink of claim 2, wherein
an amount of the light emitting element is in a range of about 0.01 to about 1 part by weight with respect to 100 parts by weight of the light emitting element ink, and
an amount of the thickener is in a range of about 5 to about 50 parts by weight with respect to 100 parts by weight of the light emitting element ink.

7. The light emitting element ink of claim 6, further comprising:
a dispersant dispersed in the light emitting element solvent,
wherein an amount of the dispersant is in a range of about 10 to about 100 parts by weight with respect to 100 parts by weight of the light emitting element.

8. The light emitting element ink of claim 1, wherein
the plurality of semiconductor layers of the light emitting element include:
a first semiconductor layer;
a second semiconductor layer; and
a light emitting layer between the first semiconductor layer and the second semiconductor layer, and
the insulating film of the light emitting element is disposed to surround at least an outer surface of the light emitting layer.

9. A method of manufacturing a display device, comprising:
preparing a light emitting element ink including a light emitting element solvent, a plurality of light emitting elements, and a thickener;
preparing a target substrate provided with a first electrode and a second electrode;
ejecting the light emitting element ink onto the target substrate at a first temperature;
forming an electric field on the target substrate to place the plurality of light emitting elements on the first electrode and the second electrode;
generating a low-pressure environment of about $10^{-4}$ Torr to about 1 Torr; and
heating the light emitting element ink in the low-pressure environment to remove the light element solvent and the thickener.

10. The method of claim 9, wherein the thickener of the light emitting element ink includes a polyol-based compound capable of forming a hydrogen bond with the light emitting element solvent or another thickener.

11. The method of claim 10, wherein
the thickener includes a compound represented by one of Chemical Formulas 1 to 8 below:

[Chemical Formula 1]
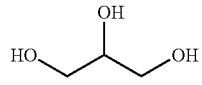

[Chemical Formula 2]
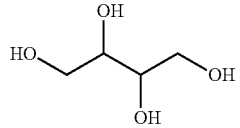

[Chemical Formula 3]
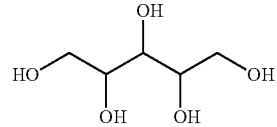

[Chemical Formula 4]
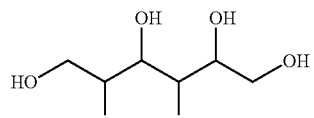

[Chemical Formula 5]

[Chemical Formula 6]
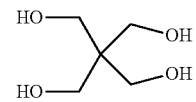

[Chemical Formula 7]
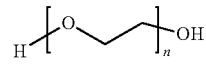

[Chemical Formula 8]
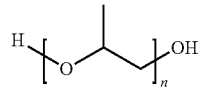

wherein, in Chemical Formulas 7 and 8, n is an integer of 1 to 1000.

12. The method of claim 10, wherein
an amount of the plurality of light emitting elements is in a range of about 0.01 to about 1 part by weight with respect to 100 parts by weight of the light emitting element ink, and
an amount of the thickener is in a range of about 100 to about 500 parts by weight with respect to 100 parts by weight of the plurality of light emitting elements.

13. The method of claim 10, wherein in the preparing of the light emitting element ink, the thickener forms an intermolecular hydrogen bond with the light emitting element solvent and another thickener to form a network structure.

14. The method of claim 13, wherein in the preparing of the light emitting element ink, the light emitting element ink has a viscosity in a range of about 20 cP to about 300 cP at a temperature of about 25° C.

15. The method of claim 10, wherein
the ejecting of the light emitting element ink is performed by a printing process by an inkjet printing apparatus, and the light emitting element ink is ejected onto the target substrate through a nozzle at the first temperature higher than about 25° C.

16. The method of claim 15, wherein
in the ejecting of the light emitting element ink, the first temperature is in a range of about 40° C. to about 60° C., and
the light emitting element ink has a viscosity in a range about 5 cP to about 15 cP at the first temperature.

17. The method of claim 16, wherein in the placing of the plurality of light emitting elements, the target substrate is heat-treated to form the electric field at the first temperature or higher.

18. The method of claim 9, wherein
the first temperature is in a range of about 25° C. to about 150° C.

19. The method of claim 9, in the placing of the plurality of light emitting elements, a first end of each of the plurality of light emitting elements is disposed on the first electrode, and
a second end of each of the plurality of light emitting elements is disposed on the second electrode.

20. The method of claim 9, wherein the plurality of light emitting elements includes:
a first semiconductor layer;
a second semiconductor layer;
an active layer between the first semiconductor layer and the second semiconductor layer; and
an insulating film disposed to surround at least an outer surface of the active layer.

21. The method of claim 9, wherein the thickener has a boiling point in a range of about 200° C. to about 450° C.

22. The method of claim 9, further comprising applying an ultraviolet light to the plurality of light emitting elements having been ejected on the target substrate while forming the electric field.

* * * * *